(12) United States Patent
Lu

(10) Patent No.: US 12,432,899 B2
(45) Date of Patent: *Sep. 30, 2025

(54) METHOD OF PREPARING SEMICONDUCTOR STRUCTURE HAVING LOW DIELECTRIC CONSTANT LAYER

(71) Applicant: NANYA TECHNOLOGY CORPORATION, New Taipei (TW)

(72) Inventor: Yu-Kai Lu, Chiayi (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 574 days.

This patent is subject to a terminal disclaimer.

(21) Appl. No.: 17/707,146

(22) Filed: Mar. 29, 2022

(65) Prior Publication Data

US 2023/0320059 A1    Oct. 5, 2023

(51) Int. Cl.
*H10B 12/00*    (2023.01)

(52) U.S. Cl.
CPC .............. *H10B 12/01* (2023.02); *H10B 12/31* (2023.02)

(58) Field of Classification Search
None
See application file for complete search history.

(56) References Cited

U.S. PATENT DOCUMENTS

| | | | |
|---|---|---|---|
| 6,472,231 B1 | 10/2002 | Gabriel et al. | |
| 7,291,553 B2 * | 11/2007 | Chen ................. | H01L 21/76813 |
| | | | 438/622 |
| 9,728,717 B2 | 8/2017 | Annunziata et al. | |
| 10,867,839 B2 | 12/2020 | Wang et al. | |
| 2003/0119307 A1 | 6/2003 | Bekiaris et al. | |
| 2006/0131754 A1 | 6/2006 | Ohtake et al. | |
| 2006/0286797 A1 | 12/2006 | Zhang et al. | |
| 2019/0385902 A1 | 12/2019 | Wang et al. | |
| 2021/0125864 A1 | 4/2021 | Jiang et al. | |
| 2021/0233805 A1 | 7/2021 | Chen et al. | |
| 2023/0290674 A1 | 9/2023 | Ho et al. | |
| 2023/0307240 A1 | 9/2023 | Li et al. | |
| 2023/0320059 A1 | 10/2023 | Lu | |

* cited by examiner

*Primary Examiner* — Michelle Mandala
(74) *Attorney, Agent, or Firm* — MUNCY, GEISSLER, OLDS & LOWE, P.C.

(57) ABSTRACT

The present application provides a method of preparing a semiconductor structure. The method includes providing a conductive film; disposing a barrier layer over the conductive film; disposing a first dielectric layer over the barrier layer; disposing a patterned hard mask over the first dielectric layer; and removing a portion of the first dielectric layer exposed through the patterned hard mask, wherein the removal of the portion of the first dielectric layer includes providing a nitrogen plasma to collide with the portion of the first dielectric layer.

16 Claims, 23 Drawing Sheets

METHOD OF PREPARING SEMICONDUCTOR STRUCTURE HAVING LOW DIELECTRIC CONSTANT LAYER

TECHNICAL FIELD

The present disclosure relates to a method of preparing a semiconductor structure, and more particularly, to a method of preparing a semiconductor structure having a low dielectric constant (low-k) layer.

DISCUSSION OF THE BACKGROUND

Dynamic random-access memory (DRAM) is a type of semiconductor arrangement for storing bits of data in separate capacitors within an integrated circuit (IC). DRAMs are commonly formed as trench capacitor DRAM cells. An advanced method of fabricating a buried gate electrode involves building a gate electrode of a transistor and a word line in a trench in an active area (AA) comprising a shallow trench isolation (STI) structure.

Over the past few decades, as semiconductor fabrication technology has continuously improved, sizes of electronic devices have been correspondingly reduced. During fabrication, deposition and removal processes are repeatedly performed. Generally, the removal process involves bombardment of plasma on a target layer. The target layer is at least partially removed by the bombardment. However, a by-product may be formed during the bombardment. The by-product can adversely affect electrical properties of the target layer as well as the overall electronic device. It is therefore desirable to develop improvements that address related manufacturing challenges.

SUMMARY

One aspect of the present disclosure provides a method of preparing a semiconductor structure. The method includes steps of providing a conductive film, disposing a barrier layer over the conductive film, disposing a first dielectric layer over the barrier layer, disposing a patterned hard mask over the first dielectric layer, and removing a portion of the first dielectric layer exposed through the patterned hard mask, wherein the removal of the portion of the first dielectric layer includes providing a nitrogen plasma to collide with the portion of the first dielectric layer.

In some embodiments, the portion of the first dielectric layer is removed to at least partially expose the barrier layer.

In some embodiments, the portion of the first dielectric layer has a height of about 5 nm.

In some embodiments, the first dielectric layer includes a low-k dielectric material or an ultra-low-k dielectric material.

In some embodiments, the first dielectric layer includes black diamond.

In some embodiments, a dielectric constant of the first dielectric layer before the removal is substantially same as a dielectric constant of the first dielectric layer after the removal.

In some embodiments, an electrical resistance of the first dielectric layer before the removal is substantially same as an electrical resistance of the first dielectric layer after the removal.

In some embodiments, a chemical reaction between the first dielectric layer and the nitrogen plasma is absent during the removal.

In some embodiments, the method further includes a second dielectric layer disposed between the first dielectric layer and the patterned hard mask.

In some embodiments, the second dielectric layer includes oxide.

In some embodiments, the conductive film includes metal.

In some embodiments, the conductive film includes copper.

In some embodiments, the barrier layer includes carbon or nitride.

In some embodiments, the barrier layer includes silicon carbide.

In some embodiments, the method further includes removing the patterned hard mask.

In some embodiments, the patterned hard mask includes a first mask layer disposed over the first dielectric layer, and a second mask layer disposed over the first mask layer.

In some embodiments, the first mask layer includes carbon.

In some embodiments, the second mask layer includes photoresist.

Another aspect of the present disclosure provides a method of preparing a semiconductor structure. The method includes steps of providing a barrier layer, disposing a first dielectric layer over the barrier layer, disposing a second dielectric layer over the first dielectric layer, disposing a patterned hard mask over the second dielectric layer, and forming an opening extending through the first dielectric layer and the second dielectric layer to at least partially expose the barrier layer, wherein the formation of the opening includes providing a plasma to collide with a portion of the first dielectric layer exposed through the patterned hard mask, and wherein the plasma is chemically unreactive with the first dielectric layer.

In some embodiments, the plasma includes nitrogen.

In some embodiments, a depth of the opening is substantially greater than about 5 nm.

In some embodiments, the plasma is chemically unreactive with black diamond.

In some embodiments, the plasma is chemically unreactive with carbon.

In some embodiments, a chemical reaction between the first dielectric layer and the plasma is absent during the formation of the opening.

In some embodiments, an oxide disposed in the opening is absent.

In some embodiments, an oxide disposed on the barrier layer is absent.

In some embodiments, the formation of the opening includes removing a portion of the second dielectric layer exposed through the patterned hard mask.

In some embodiments, the removal of the portion of the second dielectric layer is performed prior to the collision of the plasma with the first dielectric layer.

In some embodiments, the method further includes removing a portion of the barrier layer exposed through the opening.

In some embodiments, the method further includes removing the patterned hard mask to expose the second dielectric layer.

In another aspect of the present disclosure, a method of preparing a semiconductor structure is provided. The method includes steps of providing a black diamond layer; disposing a patterned hard mask over the black diamond layer; and removing a portion of the black diamond layer exposed through the patterned hard mask, wherein the removal of the portion of the black diamond layer includes colliding the portion of the black diamond layer by a plasma chemically unreactive with the black diamond layer.

In some embodiments, an oxide formed over the black diamond layer during the removal is absent.

In some embodiments, the black diamond layer is chemically reactive with oxygen.

In some embodiments, an electrical resistance and a dielectric constant of the black diamond layer remain unchanged before and after the removal.

In some embodiments, the plasma is free of oxygen.

In conclusion, because a nitrogen plasma is chemically unreactive with a low dielectric constant (low-k) layer in a semiconductor structure, the nitrogen plasma is used for removing a portion of the low-k layer. As such, formation of a by-product at a surface of the low-k layer can be minimized or prevented, and a dielectric constant of the low-k layer is not changed. In other words, an electrical resistance of the low-k layer is not increased. Therefore, an overall performance of the semiconductor structure and process of manufacturing the semiconductor structure are improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
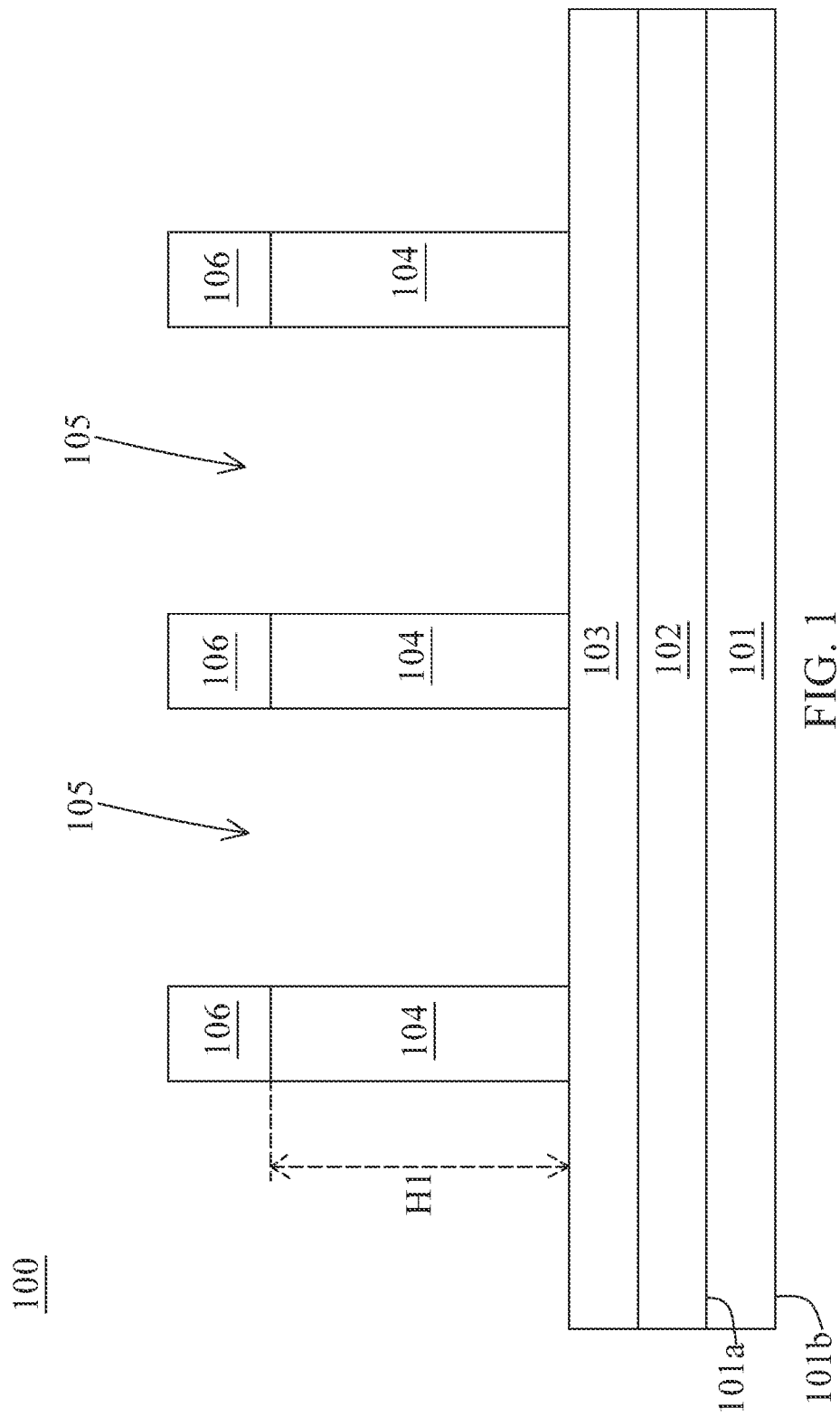
FIG. 1 is a cross-sectional side view of a first semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic cross-sectional side view of a first semiconductor structure 100 in accordance with some embodiments of the present disclosure. In some embodiments, the first semiconductor structure 100 is a part of a memory device. In some embodiments, the first semiconductor structure 100 is a part of a dynamic random-access memory (DRAM) device having several unit cells arranged in rows and columns.

In some embodiments, the first semiconductor structure 100 includes a semiconductor substrate 101. In some embodiments, the semiconductor substrate 101 includes semiconductive material such as silicon, germanium, gallium, arsenic or a combination thereof. In some embodiments, the semiconductor substrate 101 includes bulk semiconductor material. In some embodiments, the semiconductor substrate 101 is a semiconductor wafer (e.g., a silicon wafer) or a semiconductor-on-insulator (SOI) wafer (e.g., a silicon-on-insulator wafer). In some embodiments, the semiconductor substrate 101 is a silicon substrate. In some embodiments, the semiconductor substrate 101 includes lightly-doped monocrystalline silicon. In some embodiments, the semiconductor substrate 101 is a p-type substrate.

In some embodiments, the semiconductor substrate 101 includes a top surface 101a and a bottom surface 101b opposite to the top surface 101a. In some embodiments, the top surface 101a is a front side of the semiconductor substrate 101, wherein electrical devices or components are subsequently formed over the top surface 101a and configured to electrically connect to an external circuitry. In some embodiments, the bottom surface 101b is a back side of the semiconductor substrate 101, where electrical devices or components are absent.

In some embodiments, the first semiconductor structure 100 includes a conductive film 102 disposed over the semiconductor substrate 101. In some embodiments, the conductive film 102 is disposed over the top surface 101a of the semiconductor substrate 101. In some embodiments, the conductive film 102 at least partially covers the top surface 101a. In some embodiments, the conductive film 102 entirely covers the top surface 101a. In some embodiments, the conductive film 102 includes conductive material such as metal. In some embodiments, the conductive film 102 is a metallic film. In some embodiments, the conductive film 102 includes metal such as copper, gold, silver or the like.

In some embodiments, the first semiconductor structure 100 includes a barrier layer 103 disposed over the conductive film 102. In some embodiments, the barrier layer 103 is in contact with the conductive film 102. In some embodiments, the barrier layer 103 is configured to prevent diffusion of the conductive film 102. The diffusion of the conductive film 102 would reduce adhesion of the conductive film 102 and an overall reliability of the first semiconductor structure 100. In some embodiments, the barrier layer 103 includes dielectric material such as nitride, carbide or the like. In some embodiments, the barrier layer 103 includes silicon nitride, silicon carbide or the like.

In some embodiments, the first semiconductor structure 100 includes a first dielectric layer 104 disposed over the barrier layer 103, the conductive film 102 and the semiconductor substrate 101. In some embodiments, the first dielectric layer 104 is in contact with the barrier layer 103. In some embodiments, the first dielectric layer 104 extends upright and away from the barrier layer 103. In some embodiments, the barrier layer 103 is at least partially exposed through the first dielectric layer 104.

In some embodiments, the first dielectric layer 104 includes dielectric material having a low dielectric constant (low-k). In such embodiments, the first dielectric layer 104 is a low-k layer. In some embodiments, the first dielectric layer 104 includes dielectric material having an ultra-low dielectric constant (ultra-low-k). In some embodiments, the first dielectric layer 104 includes black diamond or the like. In some embodiments, a height H1 of the first dielectric layer 104 is substantially about 5 nm. In some embodiments, the height H1 is in a range of about 3 nm to about 10 nm.

In some embodiments, the first dielectric layer 104 is chemically unreactive with nitrogen or nitrogen plasma. In some embodiments, the first dielectric layer 104 is chemically reactive with oxygen or oxygen plasma. In some embodiments, an oxide disposed at or over a surface of the first dielectric layer 104 is absent. In some embodiments, there is no silicon oxide disposed at or over the surface of the first dielectric layer 104. In some embodiments, the oxide disposed at or over a surface of the barrier layer 103 is absent. In some embodiments, there is no silicon oxide disposed at or over the surface of the barrier layer 103.

In some embodiments, an opening 105 extending through the first dielectric layer 104 is included in the first semiconductor structure 100. In some embodiments, a portion of the barrier layer 103 is exposed through the opening 105. In some embodiments, the opening 105 has a consistent width along the first dielectric layer 104. In some embodiments, the opening 105 is tapered toward the barrier layer 103. In some embodiments, the oxide disposed in the opening is absent.

In some embodiments, the first semiconductor structure 100 includes a second dielectric layer 106 disposed over the first dielectric layer 104. In some embodiments, the second dielectric layer 106 is in contact with the first dielectric layer 104. In some embodiments, the first dielectric layer 104 is entirely covered by the second dielectric layer 106. In some embodiments, the second dielectric layer 106 includes dielectric material such as oxide or the like. In some embodiments, the second dielectric layer 106 includes silicon oxide or the like. In some embodiments, the second dielectric layer 106 is a capacitor oxide.

In some embodiments, a dielectric constant of the second dielectric layer 106 is substantially greater than a dielectric constant of the first dielectric layer 104. In some embodiments, the opening 105 extends through the first dielectric layer 104 and the second dielectric layer 106. In some embodiments, the height H1 of the first dielectric layer 104 is substantially greater than a height of the second dielectric layer 106.

Figure 2:
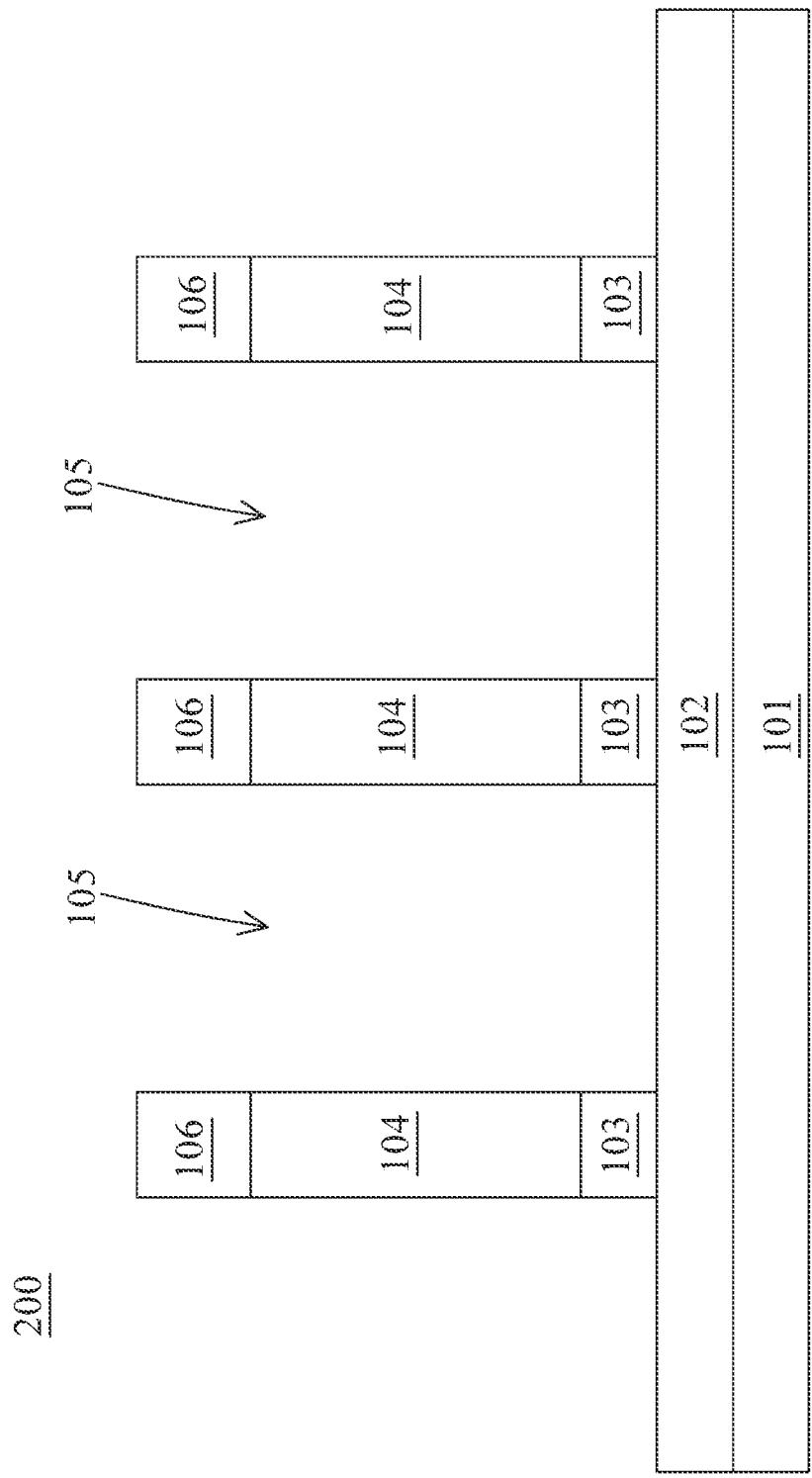
FIG. 2 is a cross-sectional side view of a second semiconductor structure in accordance with other embodiments of the present disclosure.

FIG. 2 is a schematic cross-sectional side view of a second semiconductor structure 200 in accordance with some embodiments of the present disclosure. The second semiconductor structure 200 is similar to the first semiconductor structure 100 of FIG. 1, except a portion of the barrier layer 103 is removed to at least partially expose the conductive film 102. In some embodiments, the opening 105 extends through the barrier layer 103, the first dielectric layer 104 and the second dielectric layer 106. In some embodiments, a height of the barrier layer 103 is substantially less than the height H1 of the first dielectric layer 104.

Figure 3:
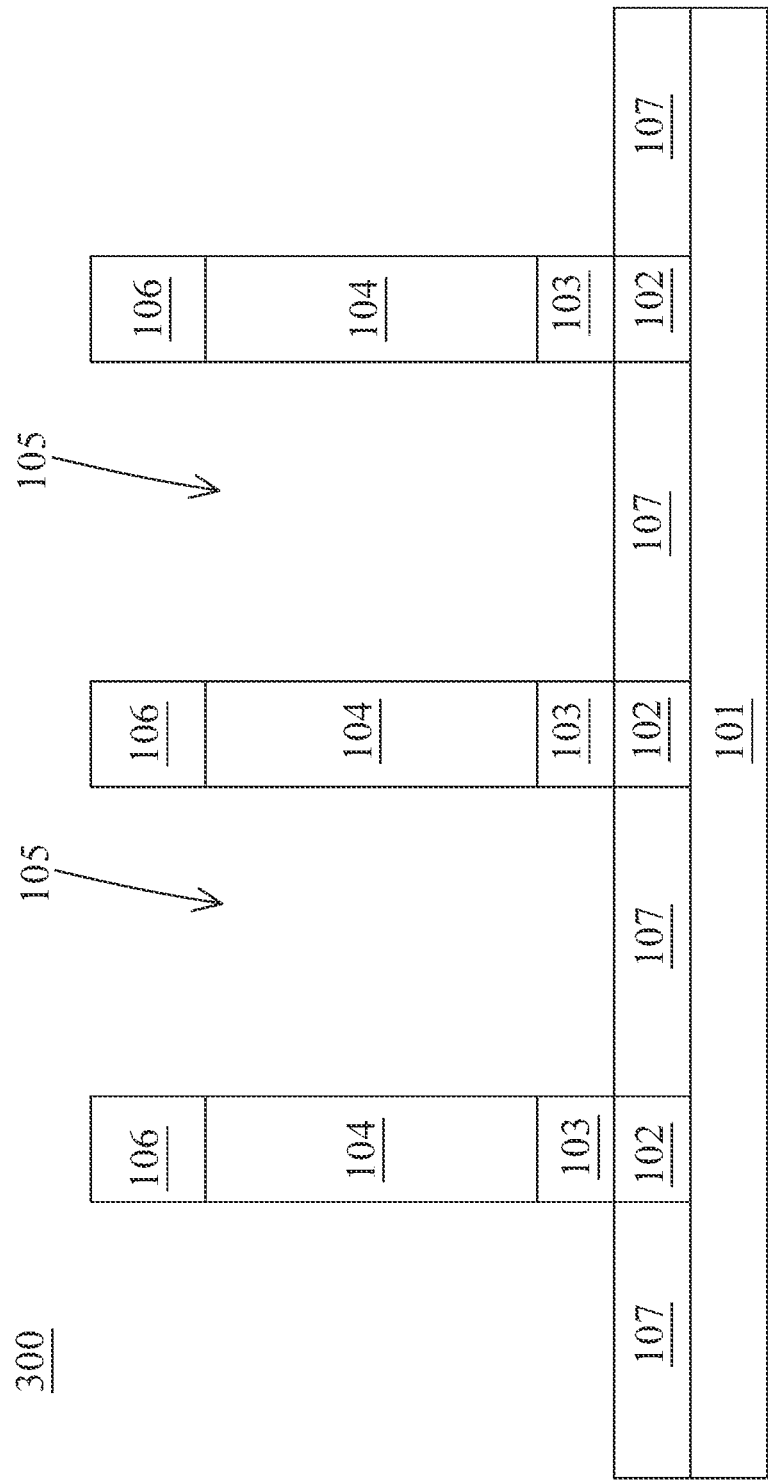
FIG. 3 is a cross-sectional side view of a third semiconductor structure in accordance with other embodiments of the present disclosure.

FIG. 3 is a schematic cross-sectional side view of a third semiconductor structure 300 in accordance with some embodiments of the present disclosure. The third semiconductor structure 300 is similar to the second semiconductor structure 200 of FIG. 2, except a portion of the conductive film 102 is removed and an isolation member 107 is disposed over the semiconductor substrate 101 and surrounded by the conductive film 102. In some embodiments, the isolation member 107 is disposed between two adjacent portions of the conductive film 102, so as to electrically isolate the two adjacent portions. In some embodiments, the isolation member 107 includes insulating material such as silicon oxide, silicon nitride, silicon oxynitride, the like, or a combination thereof.

Figure 4:
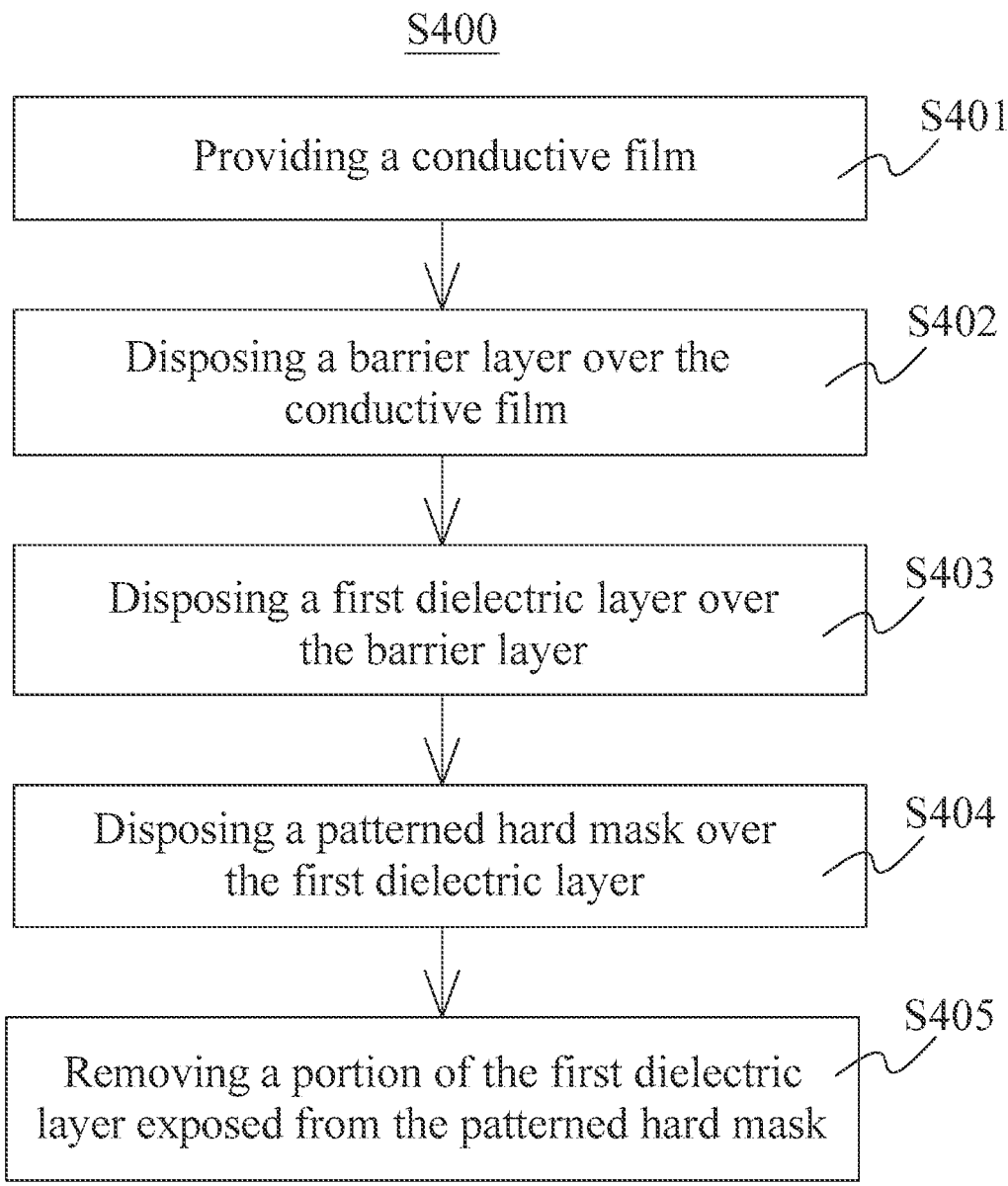
FIG. 4 is a flow diagram illustrating a method of manufacturing a semiconductor structure in accordance with some embodiments of the present disclosure.

FIG. 4 is a flow diagram illustrating a method S400 of manufacturing the first semiconductor structure 100, the second semiconductor structure 200 or the third semiconductor structure 300 in accordance with some embodiments of the present disclosure, and FIGS. 5 to 23 illustrate cross-sectional views of intermediate stages in preparation of the first semiconductor structure 100, the second semiconductor structure 200 or the third semiconductor structure 300 in accordance with some embodiments of the present disclosure.

The stages shown in FIGS. 5 to 23 are also illustrated schematically in the flow diagram in FIG. 4. In following discussion, the fabrication stages shown in FIGS. 5 to 23 are discussed in reference to process steps shown in FIG. 4. The method S400 includes a number of operations, and description and illustration are not deemed as a limitation to a sequence of the operations. The method S400 includes a number of steps (S401, S402, S403, S404 and S405).

Figure 5:
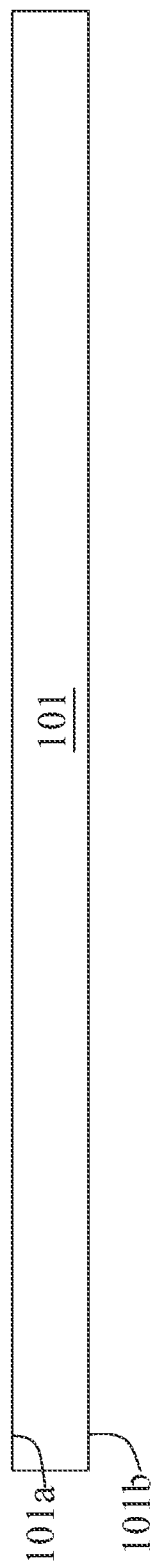
FIGS. 5 to 23 illustrate cross-sectional views of intermediate stages in the preparation of a semiconductor structure in accordance with some embodiments of the present disclosure.

Referring to FIG. 5, a semiconductor substrate 101 is provided. In some embodiments, the semiconductor substrate 101 includes semiconductive material such as silicon, germanium, gallium, arsenic or a combination thereof. In some embodiments, the semiconductor substrate 101 includes bulk semiconductor material. In some embodiments, the semiconductor substrate 101 is a semiconductor wafer (e.g., a silicon wafer) or a semiconductor-on-insulator (SOI) wafer (e.g., a silicon-on-insulator wafer). In some embodiments, the semiconductor substrate 101 is a silicon substrate.

In some embodiments, the semiconductor substrate 101 includes a top surface 101a and a bottom surface 101b opposite to the top surface 101a. In some embodiments, the top surface 101a is a front side of the semiconductor substrate 101. In some embodiments, the bottom surface 101b is a back side of the semiconductor substrate 101, where electrical devices or components are absent. In some embodiments, the semiconductor substrate 101 has configurations similar to those discussed above or illustrated in any one of FIGS. 1 to 3.

Figure 6:
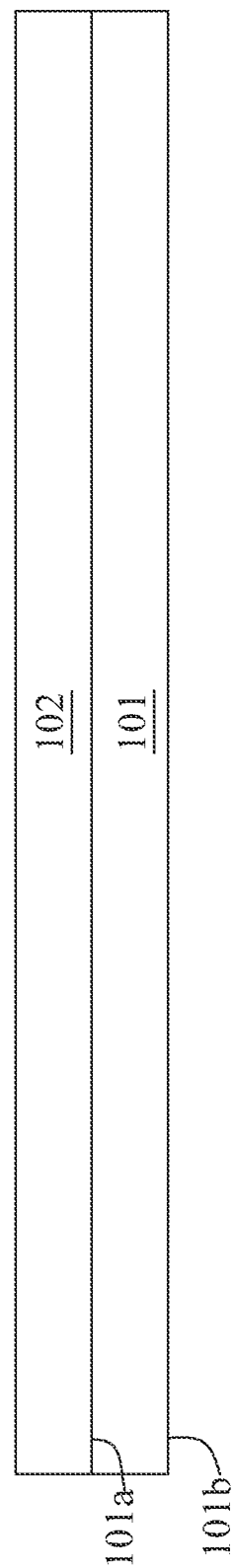

Referring to FIG. 6, a conductive film 102 is provided according to step S401 in FIG. 4. In some embodiments, the conductive film 102 is disposed over the semiconductor substrate 101. In some embodiments, the conductive film 102 is disposed over the top surface 101a of the semiconductor substrate 101. In some embodiments, the conductive film 102 at least partially or entirely covers the top surface 101a.

In some embodiments, the conductive film 102 includes conductive material such as metal. In some embodiments, the conductive film 102 is a metallic film. In some embodiments, the conductive film 102 includes metal such as copper, gold, silver or the like. In some embodiments, the conductive film 102 is disposed by sputtering, electroplating or any other suitable process. In some embodiments, the conductive film 102 has configurations similar to those discussed above or illustrated in any one of FIGS. 1 to 3.

Figure 7:
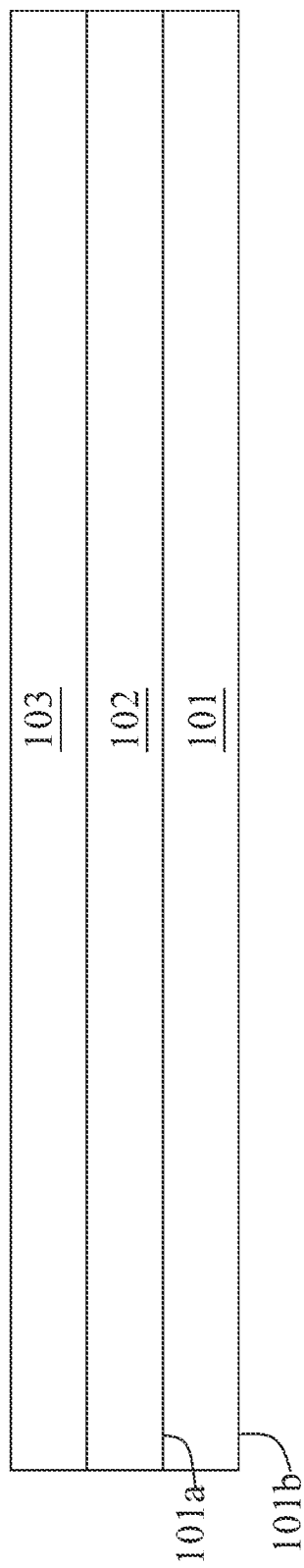

Referring to FIG. 7, a barrier layer 103 is disposed over the conductive film 102 according to step S402 in FIG. 4. In some embodiments, the barrier layer 103 is in contact with the conductive film 102. In some embodiments, the conductive film 102 is entirely covered by the barrier layer 103. In some embodiments, the barrier layer 103 includes dielectric material such as nitride, carbide or the like. In some embodiments, the barrier layer 103 is disposed by deposition, chemical vapor deposition (CVD) or any other suitable process.

Figure 8:
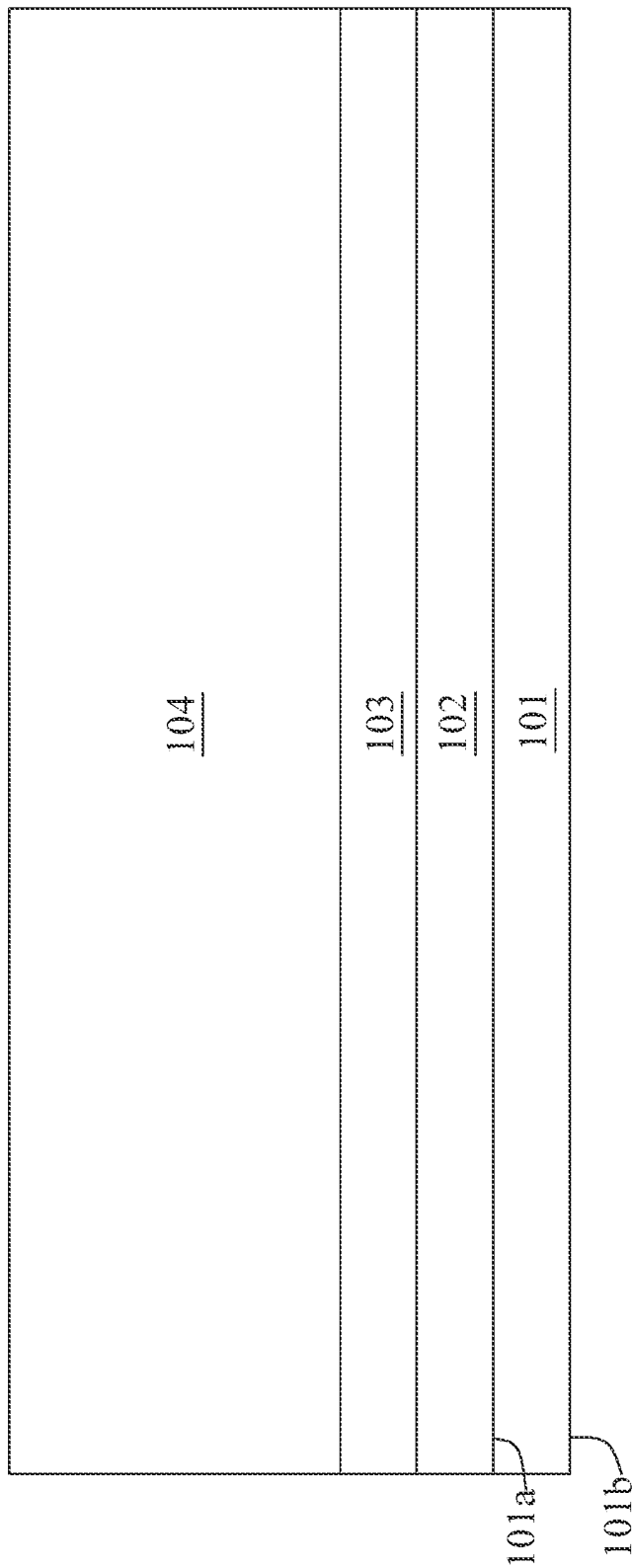

Referring to FIG. 8, a first dielectric layer 104 is disposed over the barrier layer 103 according to step S403 in FIG. 4. In some embodiments, the first dielectric layer 104 is in contact with the barrier layer 103. In some embodiments, the first dielectric layer 104 entirely covers the barrier layer 103. In some embodiments, the first dielectric layer 104 includes dielectric material having a low dielectric constant (low-k). In such embodiments, the first dielectric layer 104 is a low-k layer.

In some embodiments, the first dielectric layer 104 includes dielectric material having an ultra-low dielectric constant (ultra-low-k). In some embodiments, the first dielectric layer 104 includes black diamond or the like. In some embodiments, the first dielectric layer 104 is chemically unreactive with nitrogen or nitrogen plasma. In some embodiments, the first dielectric layer 104 is chemically reactive with oxygen or oxygen plasma. In some embodiments, the first dielectric layer 104 is disposed by deposition, chemical vapor deposition (CVD) or any other suitable process.

Figure 9:
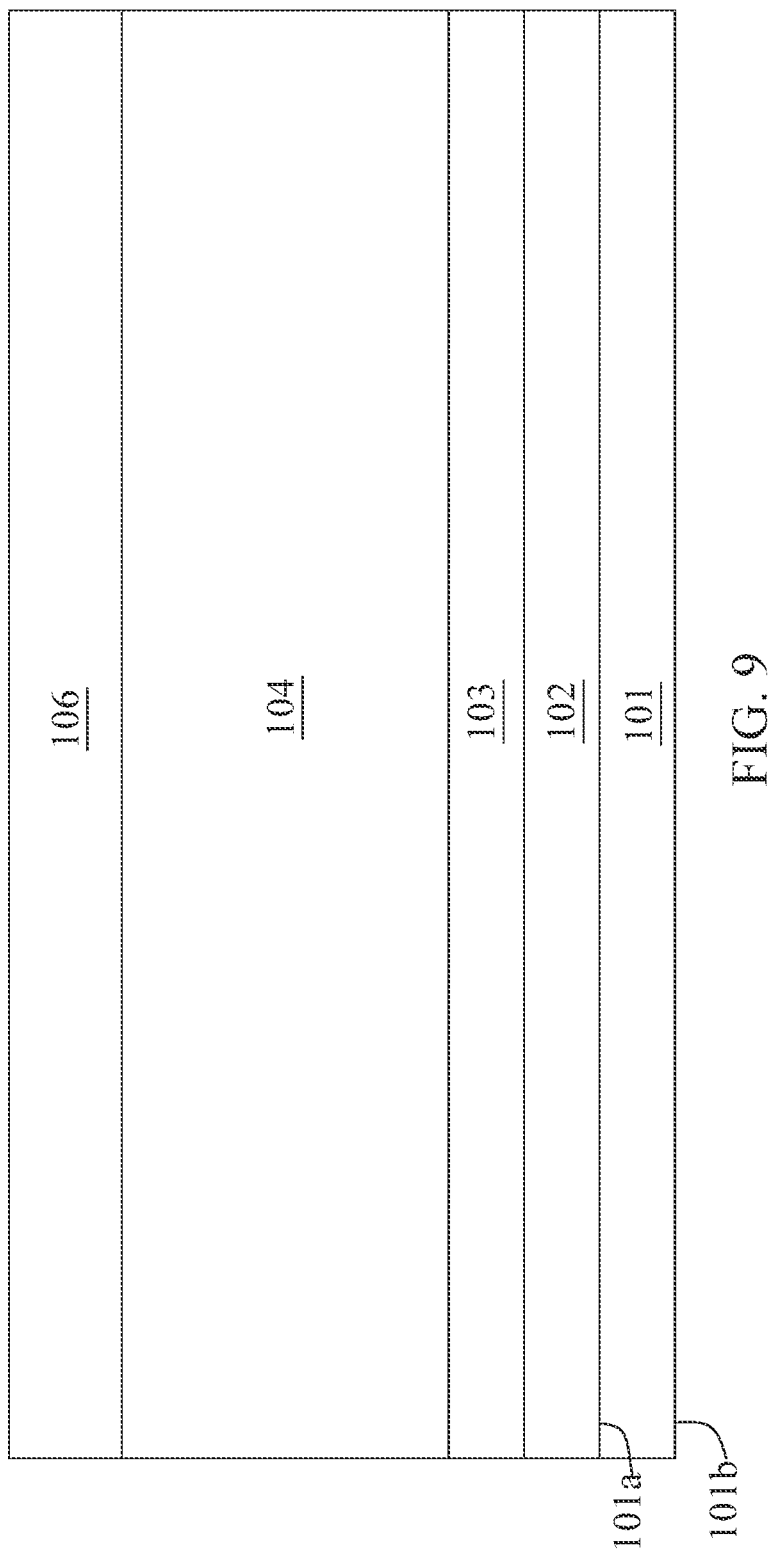

In some embodiments, a second dielectric layer 106 is disposed over the first dielectric layer 104 as shown in FIG. 9. In some embodiments, the second dielectric layer 106 is disposed after the disposing of the first dielectric layer 104. In some embodiments, the second dielectric layer 106 is in contact with the first dielectric layer 104. In some embodiments, the second dielectric layer 106 entirely covers the first dielectric layer 104.

In some embodiments, the second dielectric layer 106 includes dielectric material such as oxide or the like. In some embodiments, the second dielectric layer 106 is a capacitor oxide. In some embodiments, a dielectric constant of the second dielectric layer 106 is substantially greater than a dielectric constant of the first dielectric layer 104. In some embodiments, a height H1 of the first dielectric layer 104 is substantially greater than a height of the second dielectric layer 106. In some embodiments, the second dielectric layer 106 is disposed by deposition, chemical vapor deposition (CVD) or any other suitable process.

Figure 10:
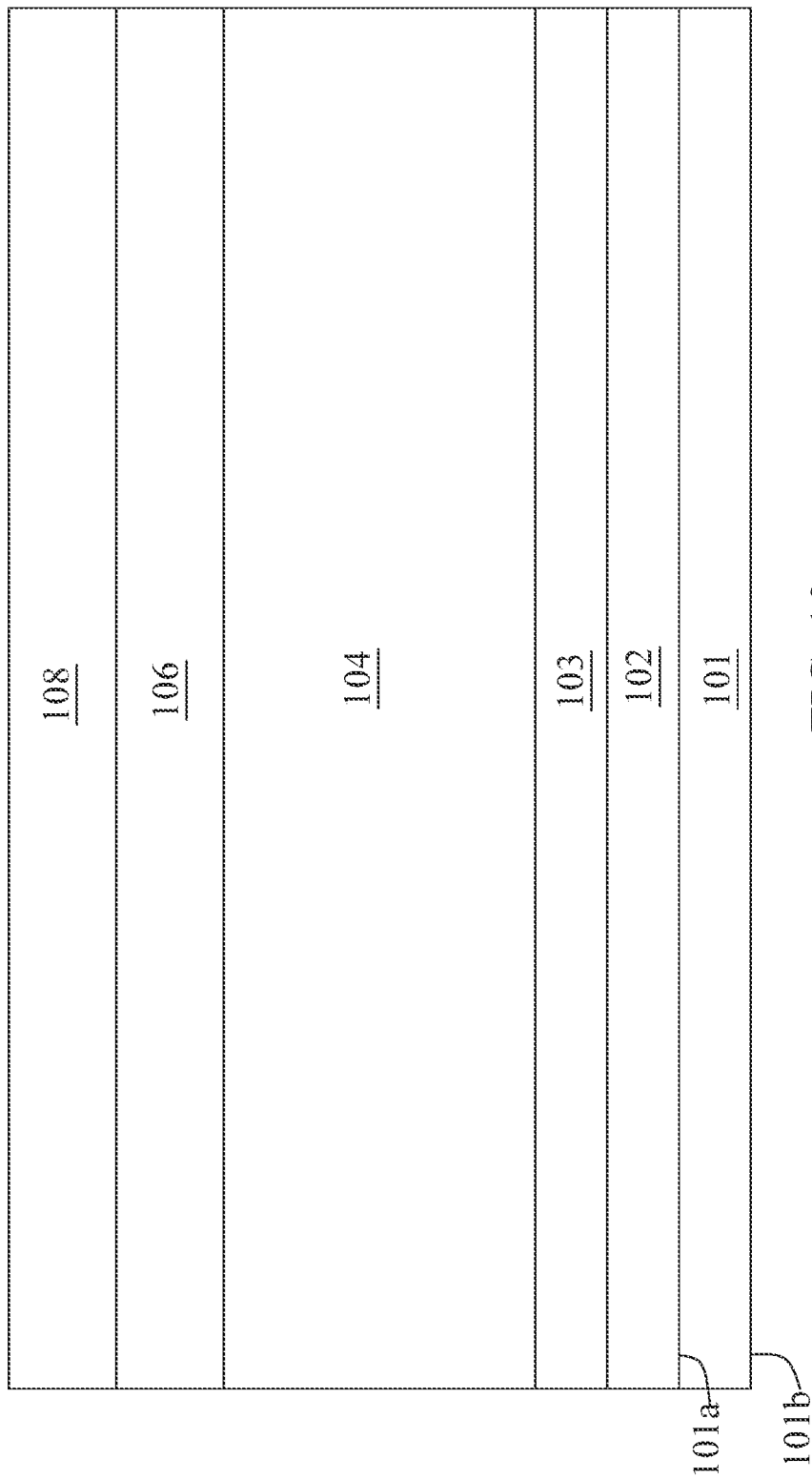

Referring to FIGS. 10 to 13, a patterned hard mask 110 is disposed over the first dielectric layer 104 according to step S404 in FIG. 4. In some embodiments, the disposing of the patterned hard mask 110 includes disposing a first mask layer 108 over the first dielectric layer 104 as shown in FIG. 10. In some embodiments, the first mask layer 108 is in contact with the second dielectric layer 106. In some embodiments, the first mask layer 108 includes carbon or the like. In some embodiments, the first mask layer 108 is an under layer. In some embodiments, the first mask layer 108 is disposed by deposition, chemical vapor deposition (CVD) or any other suitable process.

Figure 11:
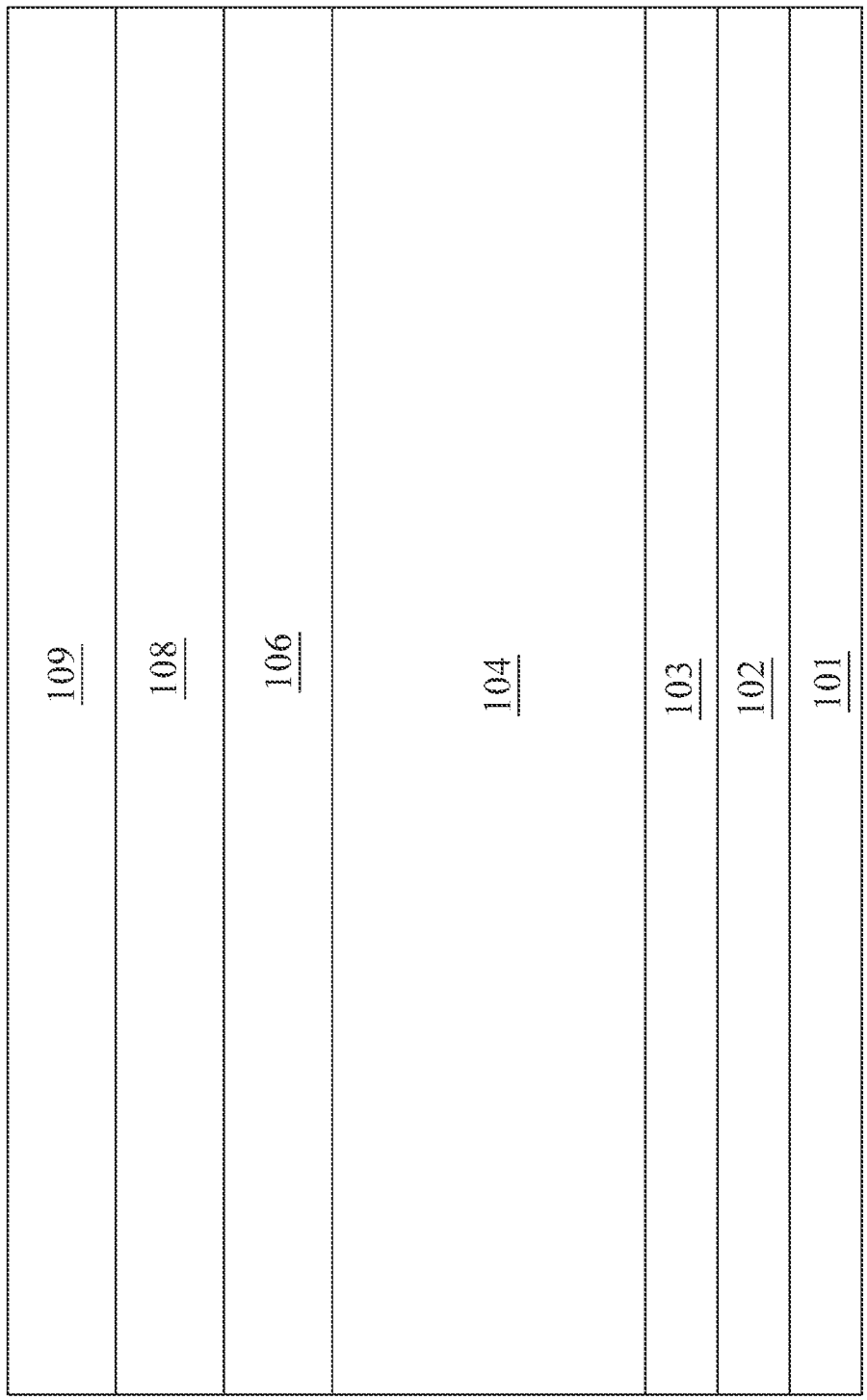

In some embodiments, after the disposing of the first mask layer 108, a second mask layer 109 is disposed over the first mask layer 108 as shown in FIG. 11. In some embodiments, the second mask layer 109 is in contact with the first mask layer 108. In some embodiments, the second mask layer 109 includes photoresist or the like. In some embodiments, the second mask layer 109 is disposed by spin coating, deposition, chemical vapor deposition (CVD) or any other suitable process.

Figure 12:
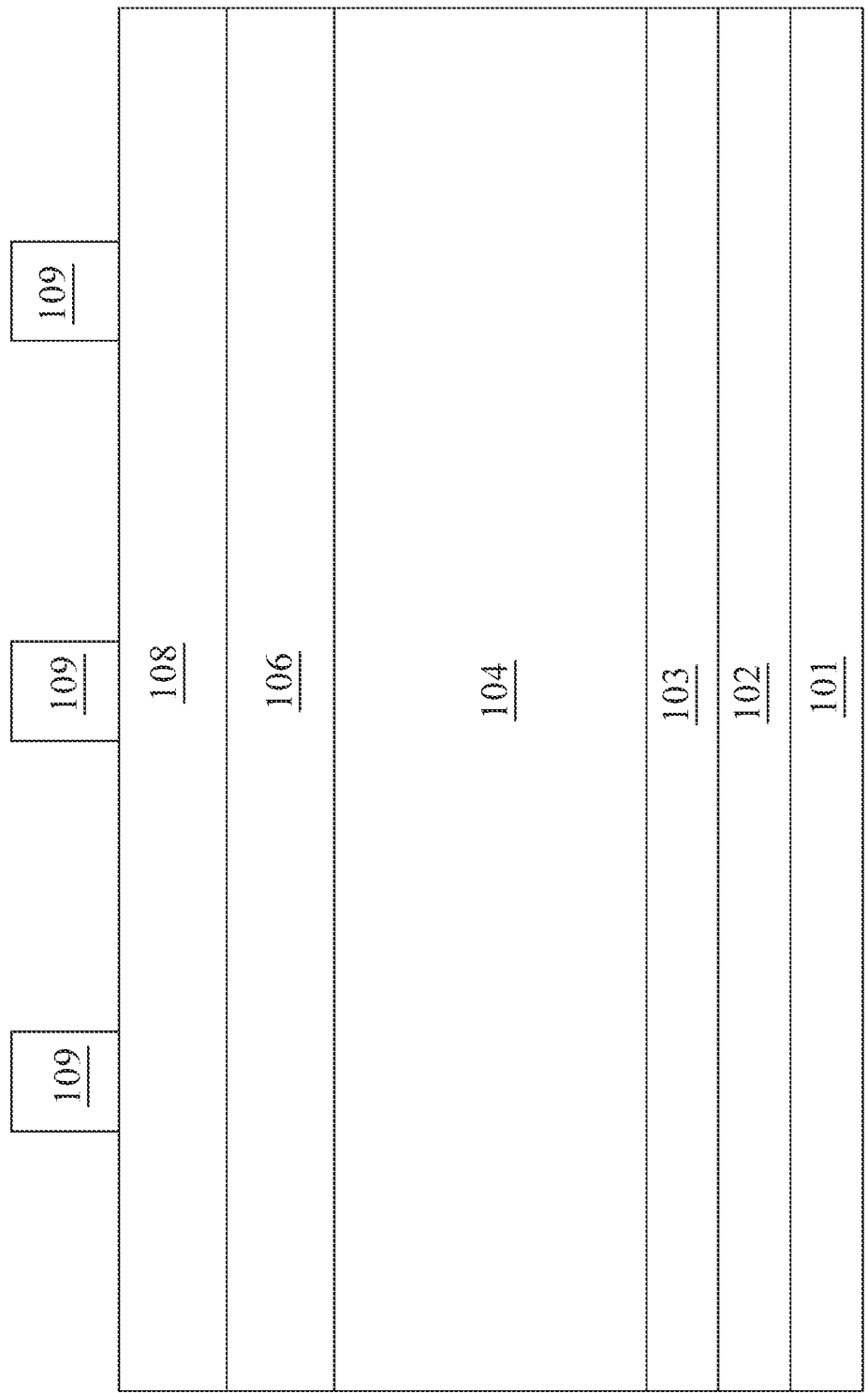
Figure 13:
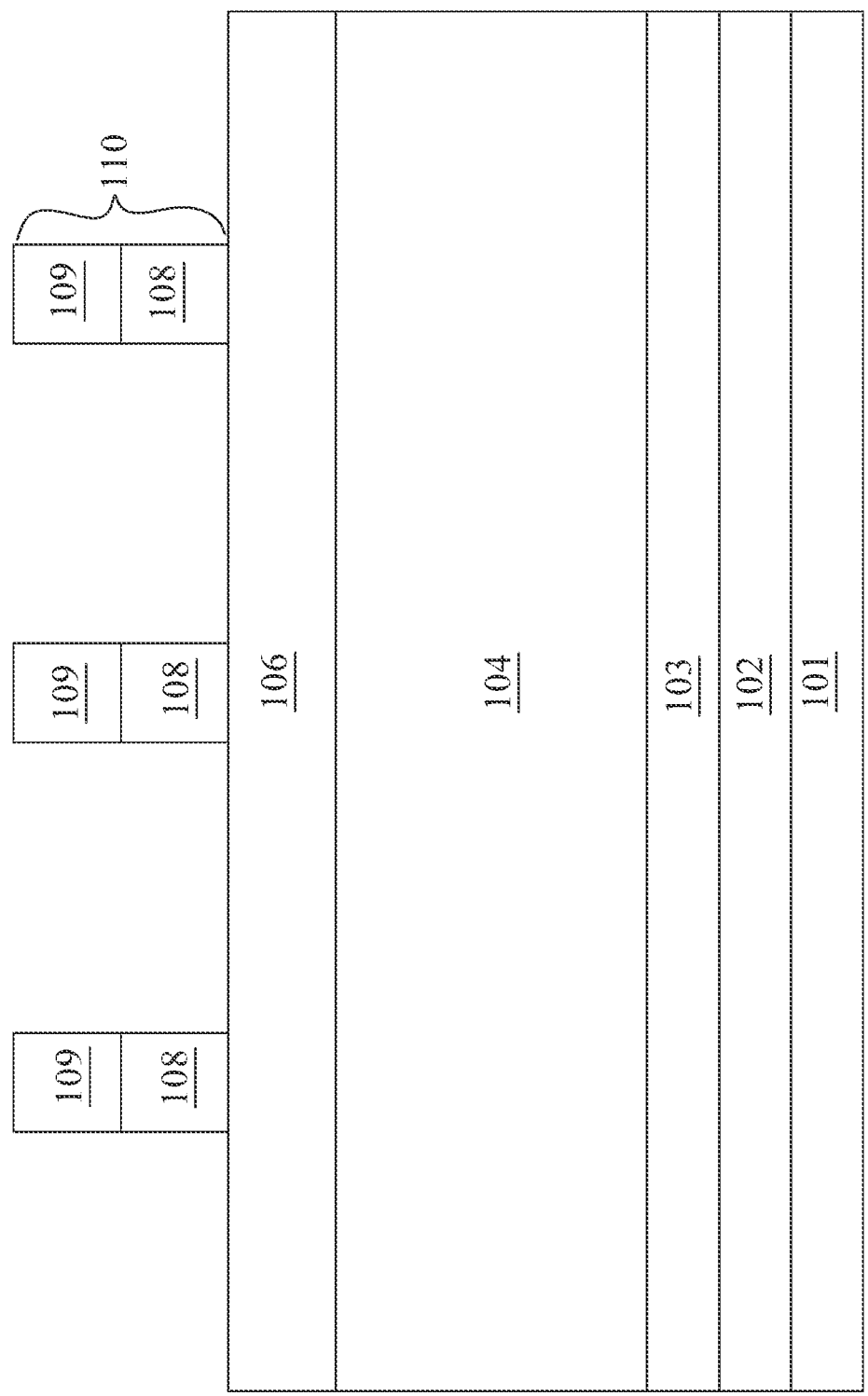

In some embodiments, after the disposing of the first mask layer 108 and the disposing of the second mask layer 109, a portion of the first mask layer 108 and a portion of the second mask layer 109 are removed to form the patterned hard mask 110 as shown in FIG. 13. In some embodiments, the removal of the portion of the first mask layer 108 is illustrated in FIG. 13, and the removal of the portion of the second mask layer 109 is illustrated in FIG. 12.

In some embodiments, the removal of the portion of the second mask layer 109 is performed prior to the removal of the portion of the first mask layer 108. In some embodiments, the portion of the second mask layer 109 is removed by photolithography, etching or any other suitable process. In some embodiments, the first mask layer 108 is at least partially exposed through the second mask layer 109 after the removal of the portion of the second mask layer 109.

In some embodiments, after the removal of the portion of the second mask layer 109, the portion of the first mask layer 108 is removed as shown in FIG. 13. In some embodiments, the portion of the first mask layer 108 is removed by photolithography, etching or any other suitable process. In some embodiments, the second dielectric layer 106 is at least partially exposed through the second mask layer 109 and the first mask layer 108 after the removal of the portion of the first mask layer 108. In some embodiments, the patterned hard mask 110 is formed and disposed over the first dielectric layer 104 as shown in FIG. 13. In some embodiments, the second dielectric layer 106 is disposed between the first dielectric layer 104 and the patterned hard mask 110.

Figure 14:
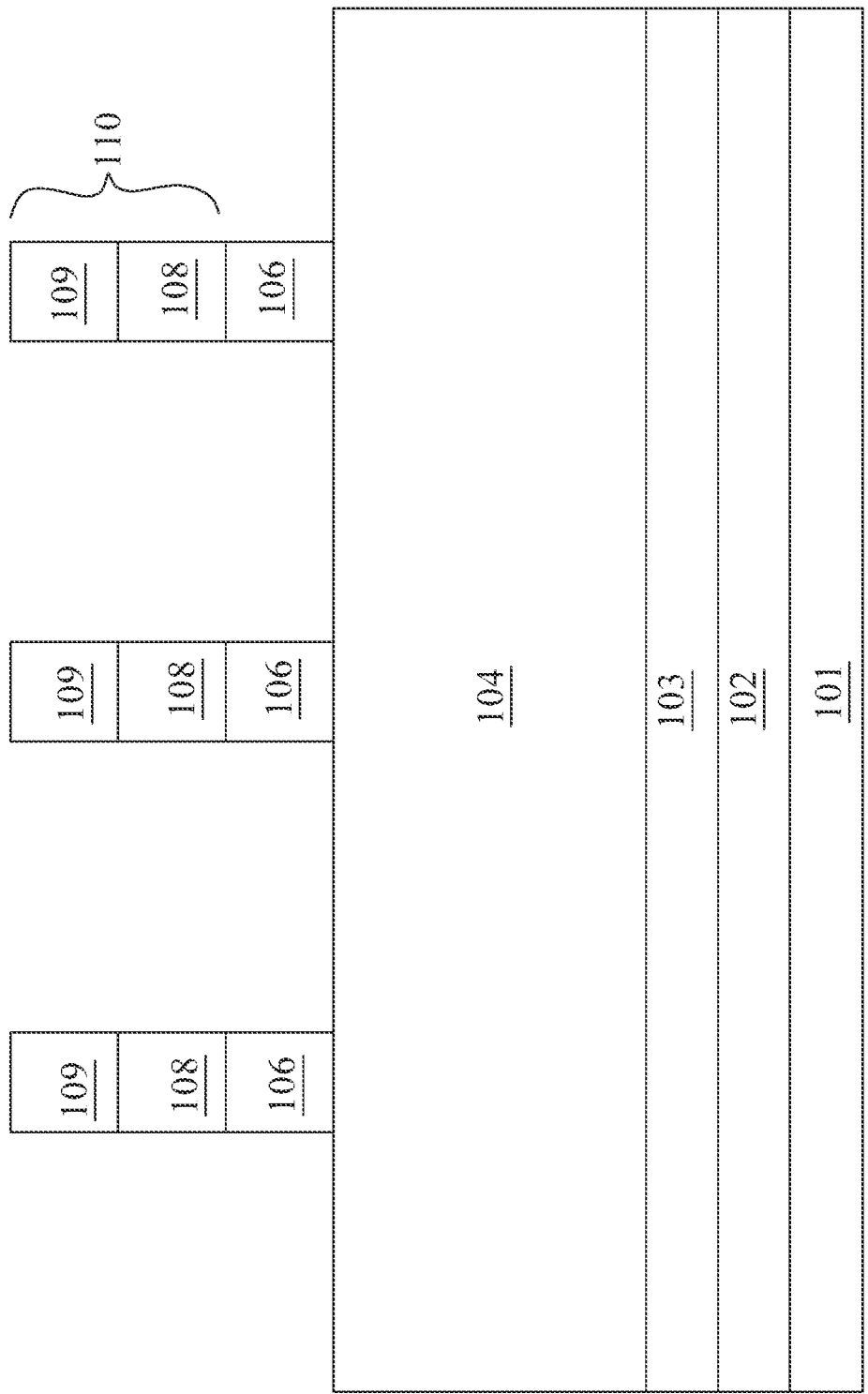

In some embodiments, after the disposing of the patterned hard mask 110, a portion of the second dielectric layer 106 is removed as shown in FIG. 14. In some embodiments, the portion of the second dielectric layer 106 exposed through the patterned hard mask 110 is removed. In some embodiments, the portion of the second dielectric layer 106 is removed by photolithography, etching or any other suitable process. In some embodiments, the first dielectric layer 104 is at least partially exposed through the patterned hard mask 110 and the second dielectric layer 106 after the removal of the portion of the second dielectric layer 106.

Figure 15:
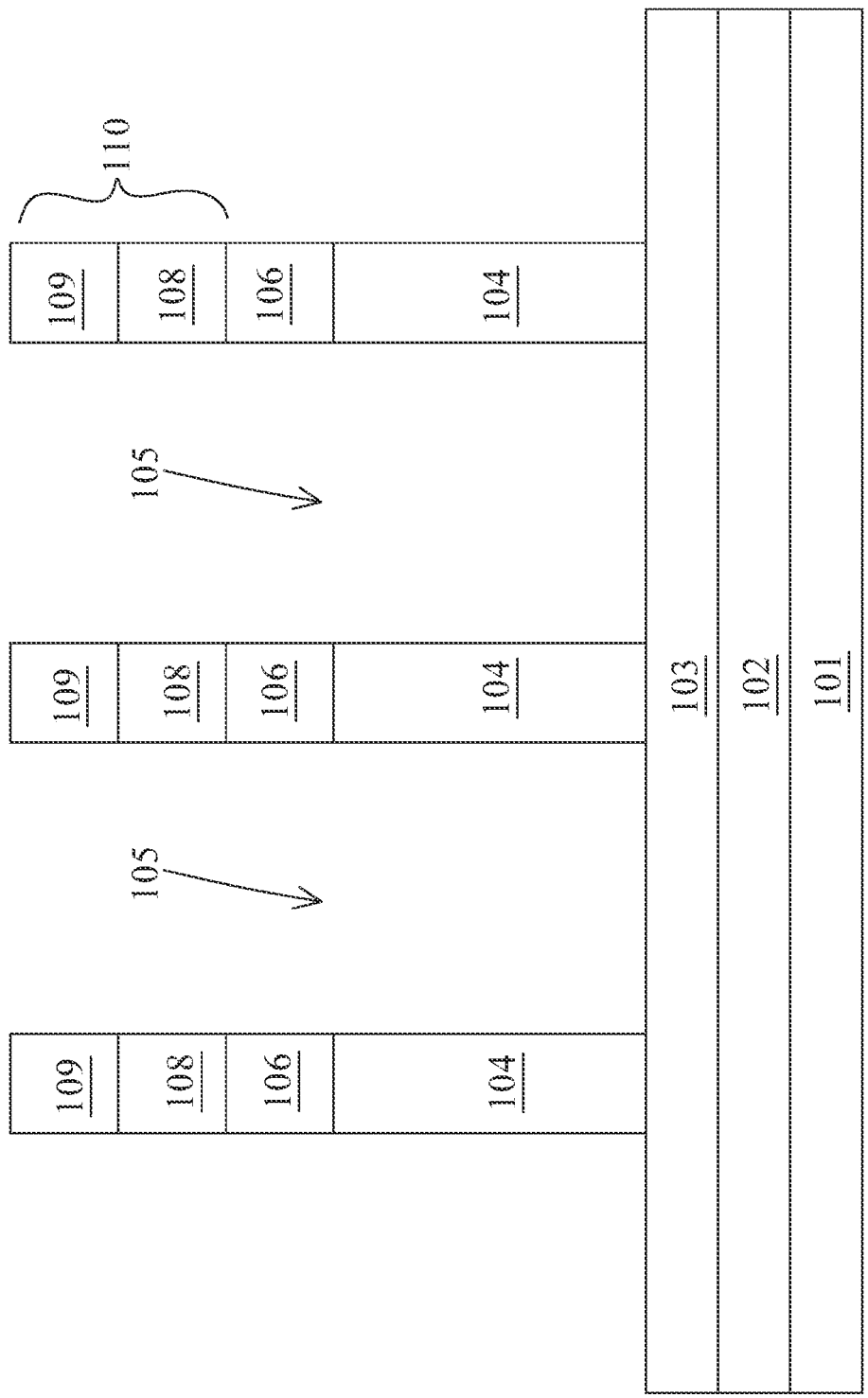

Referring to FIG. 15, a portion of the first dielectric layer 104 exposed through the patterned hard mask is removed according to step S405 in FIG. 4. In some embodiments, the portion of the first dielectric layer 104 is removed by etching, dry etching or any other suitable process. In some embodiments, the portion of the first dielectric layer 104 is removed by bombardment of a plasma toward the first dielectric layer 104. In some embodiments, the plasma is provided to collide with the portion of the first dielectric layer 104 exposed through the patterned hard mask 110.

In some embodiments, the removal of the portion of the second dielectric layer 106 is performed prior to the collision of the plasma with the first dielectric layer 104. In some embodiments, the portion of the first dielectric layer 104 is removed to at least partially expose the barrier layer 103. In some embodiments, an opening 105 extending through the first dielectric layer 104 and the second dielectric layer 106 is formed. The opening 105 at least partially exposes the barrier layer 103. In some embodiments, a depth of the opening is substantially greater than about 5 nm.

In some embodiments, the plasma includes nitrogen. In some embodiments, the plasma includes a substance chemically unreactive with the first dielectric layer 104. In some embodiments, the plasma includes a substance chemically unreactive with black diamond. In some embodiments, the plasma includes a substance chemically unreactive with carbon. In some embodiments, the plasma is free of oxide or is free of oxide-containing substance.

In some embodiments, the removal of the portion of the first dielectric layer 104 includes providing a nitrogen plasma to collide with the portion of the first dielectric layer 104. In some embodiments, a chemical reaction between the first dielectric layer 104 and the nitrogen plasma is absent during the removal. In some embodiments, the nitrogen plasma is chemically unreactive with black diamond. In some embodiments, an oxide disposed over a surface of the first dielectric layer 104, a surface of the barrier layer 103 and in the opening 105 are absent, since the nitrogen plasma is chemically unreactive with the first dielectric layer 104.

In some embodiments, a dielectric constant of the first dielectric layer 104 before the removal of the portion of the first dielectric layer 104 is substantially same as a dielectric constant of the first dielectric layer 104 after the removal of the portion of the first dielectric layer 104. In some embodiments, an electrical resistance of the first dielectric layer 104 before the removal of the portion of the first dielectric layer 104 is substantially same as an electrical resistance of the first dielectric layer 104 after the removal of the portion of the first dielectric layer 104. Since the oxide is not formed during the removal of the portion of the first dielectric layer 104, the dielectric constant and the electrical resistance of the first dielectric layer 104 are not affected or increased by the removal of the portion of the first dielectric layer 104.

Figure 16:
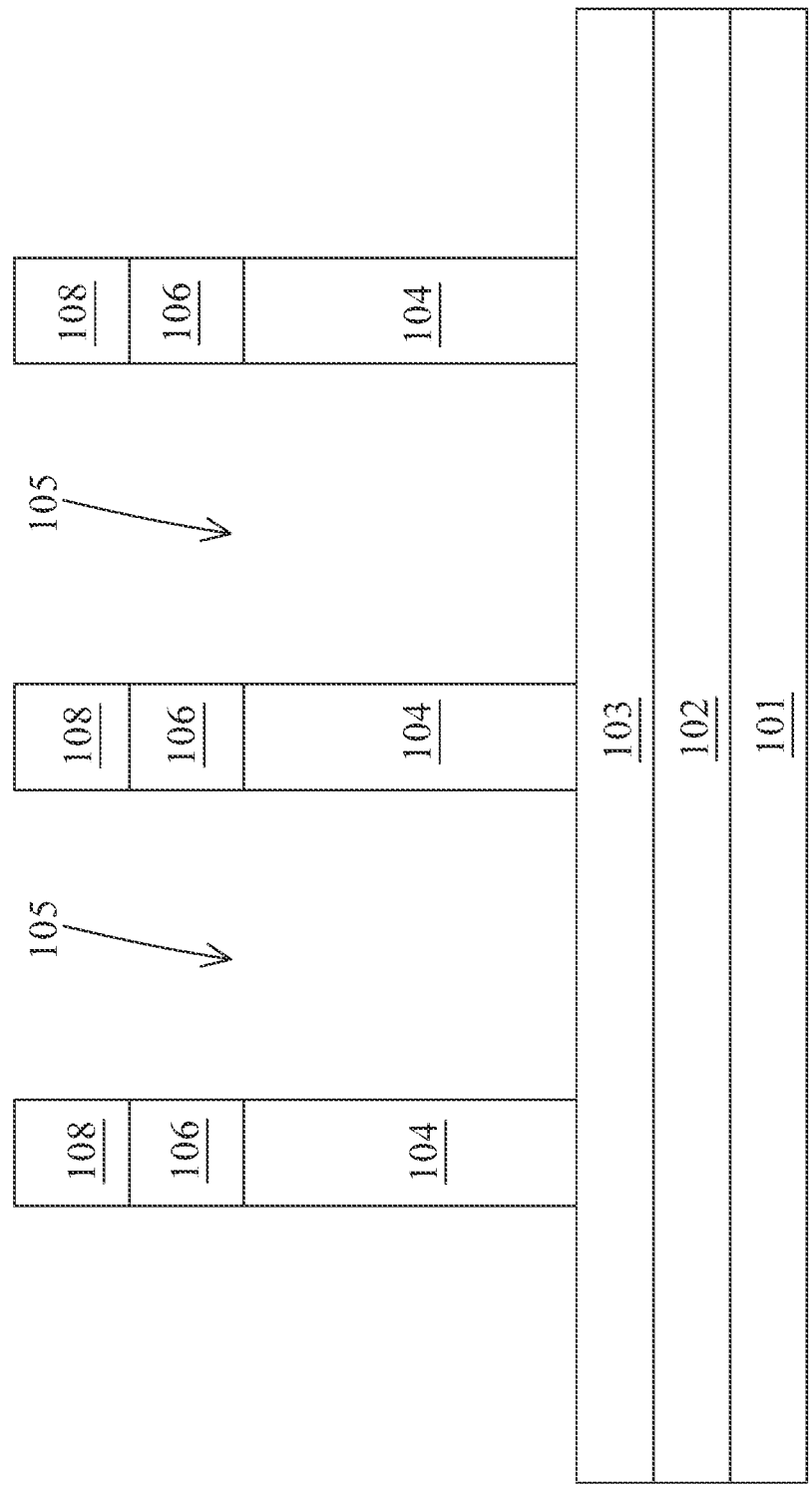
Figure 17:
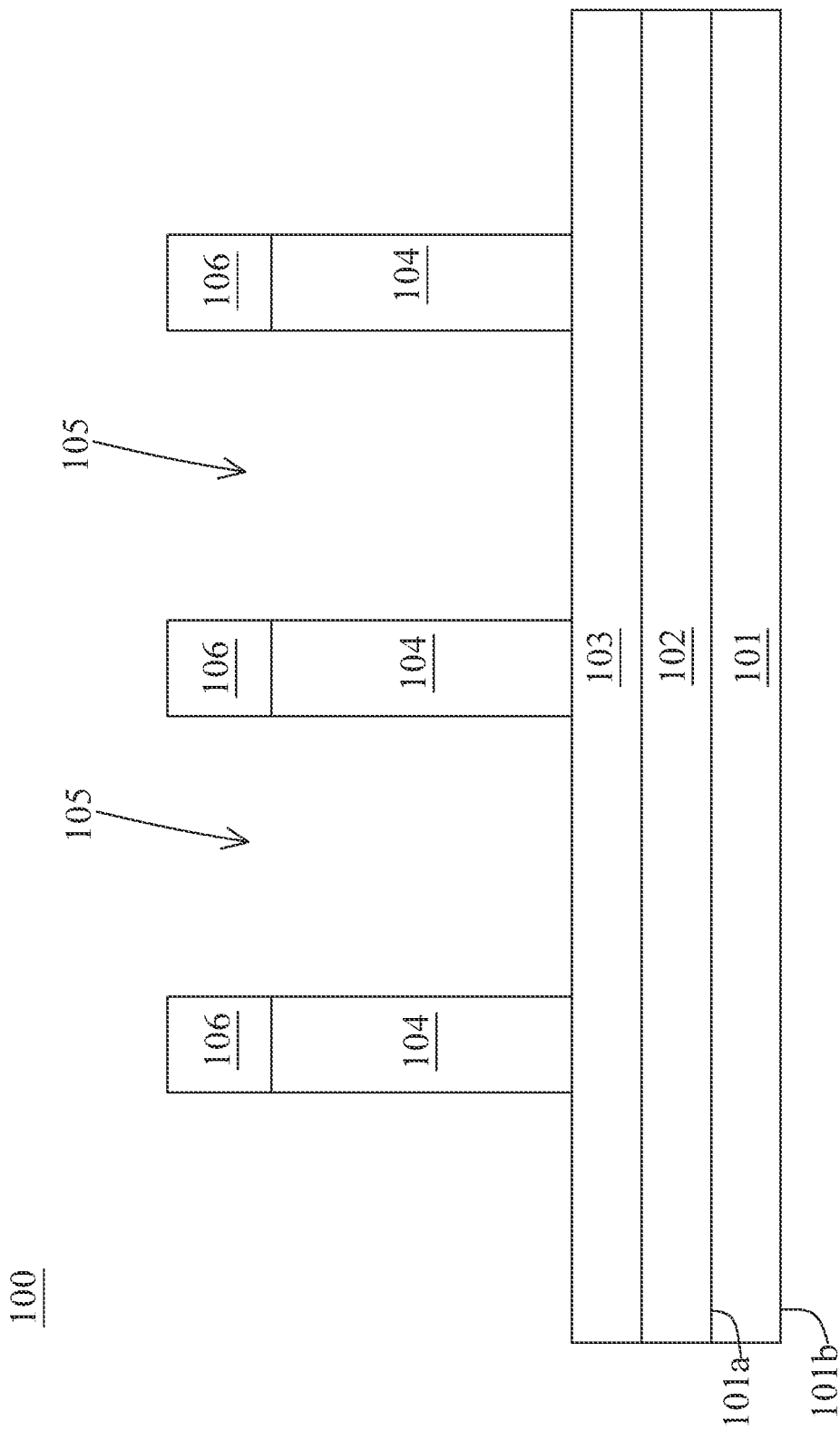

In some embodiments, the patterned hard mask 110 is removed as shown in FIGS. 16 to 17. In some embodiments, the first semiconductor structure 100 of FIG. 1 is prepared after the removal of the patterned hard mask 110 as shown in FIG. 17. In some embodiments, the removal of the patterned hard mask 110 includes removing the second mask layer 109 as shown in FIG. 16 and removing the first mask layer 108 as shown in FIG. 17. In some embodiments, the first mask layer 108 and the second mask layer 109 are removed simultaneously or sequentially. In some embodiments, the first mask layer 108 and the second mask layer 109 are removed by photolithography, etching or any other suitable process.

Figure 18:
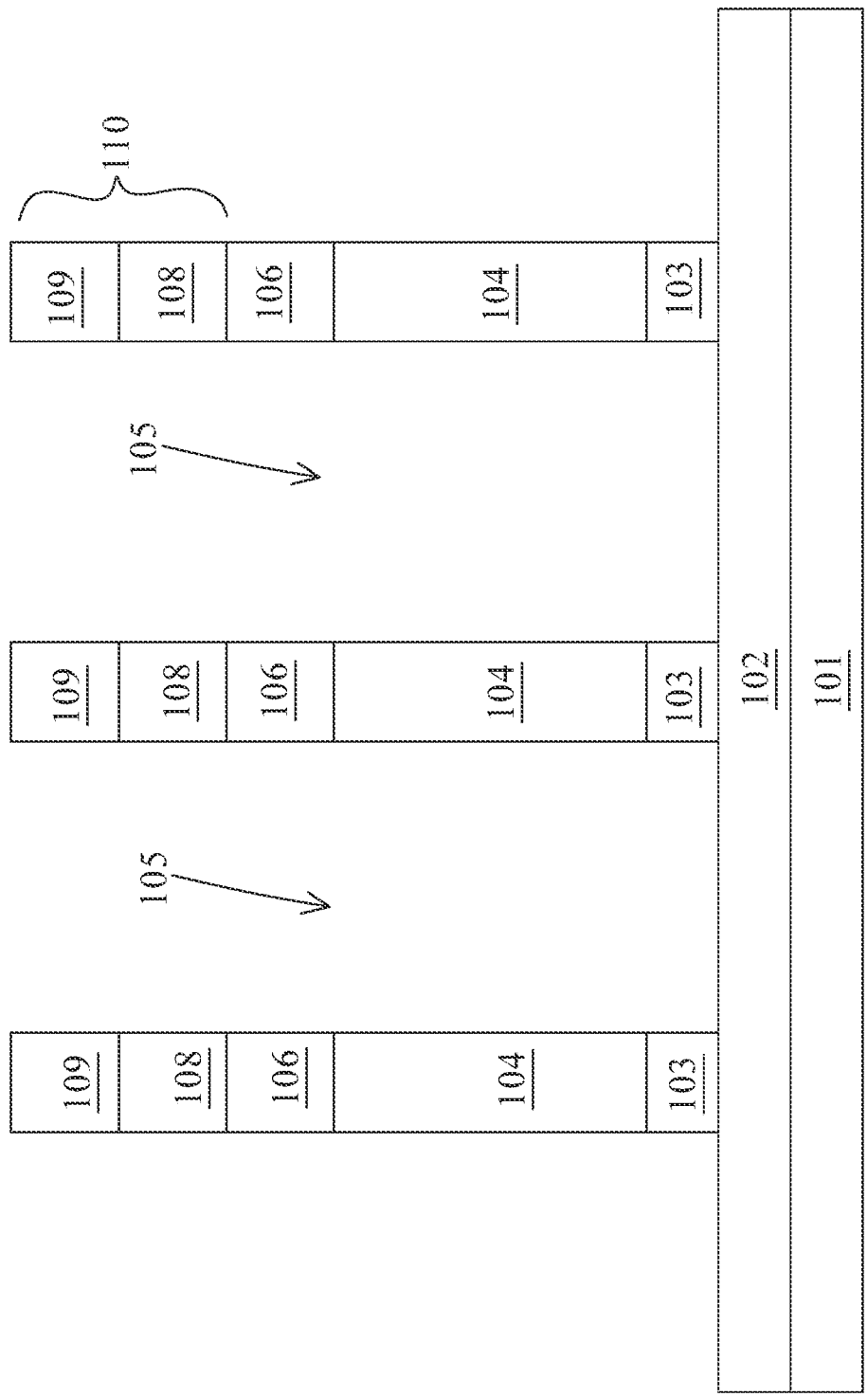

In some embodiments, the second semiconductor structure 200 of FIG. 2 can be prepared by the following steps after the removal of the portion of the first dielectric layer 104 as shown in FIG. 15. After the removal of the portion of the first dielectric layer 104 as shown in FIG. 15, a portion of the barrier layer 103 exposed through the patterned hard mask 110 is removed as shown in FIG. 18. In some embodiments, the portion of the barrier layer 103 is removed by photolithography, etching or any other suitable process. In some embodiments, the conductive film 102 is at least partially exposed through the barrier layer 103 after the removal of the portion of the barrier layer 103.

Figure 19:
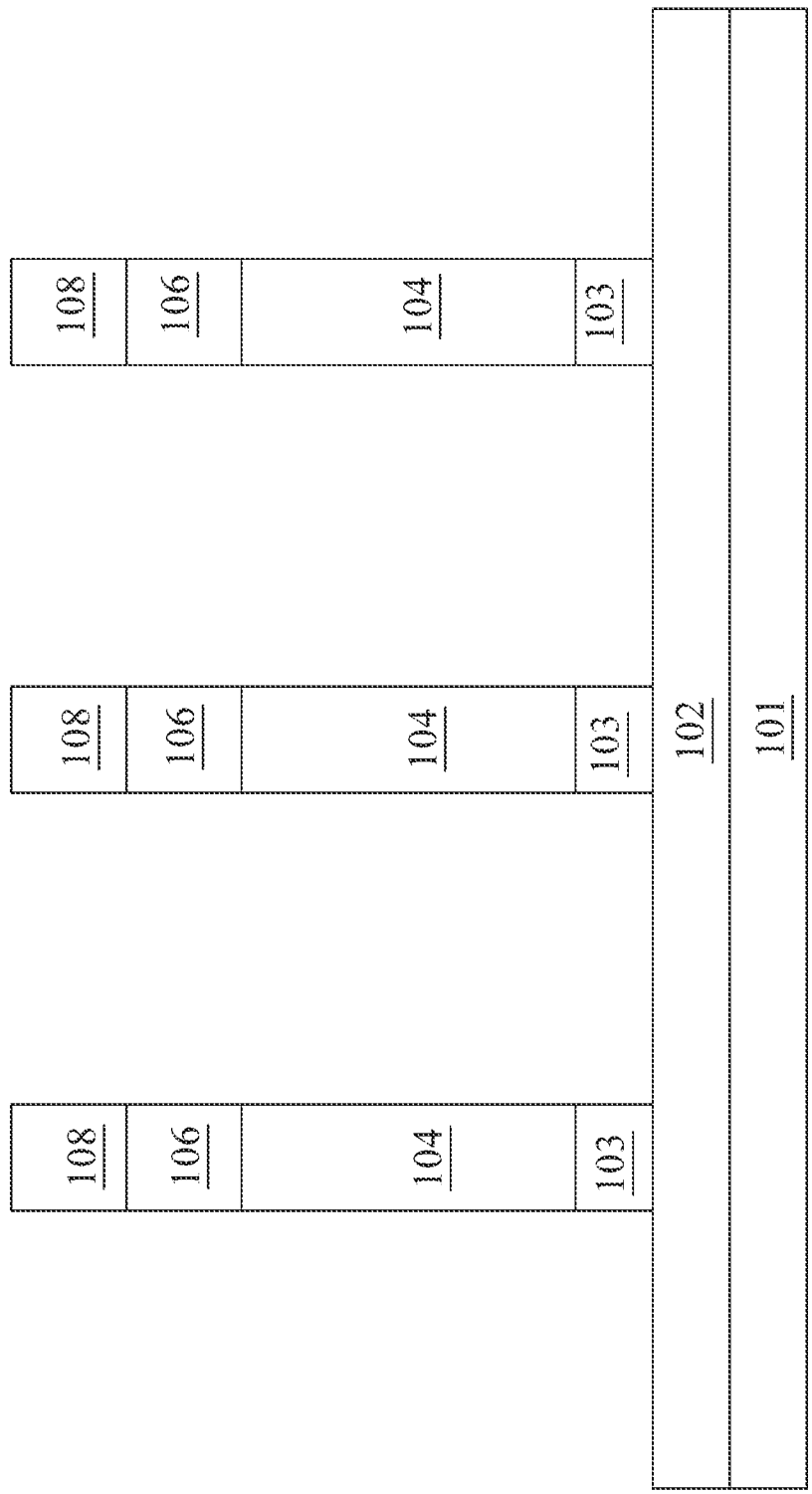
Figure 20:
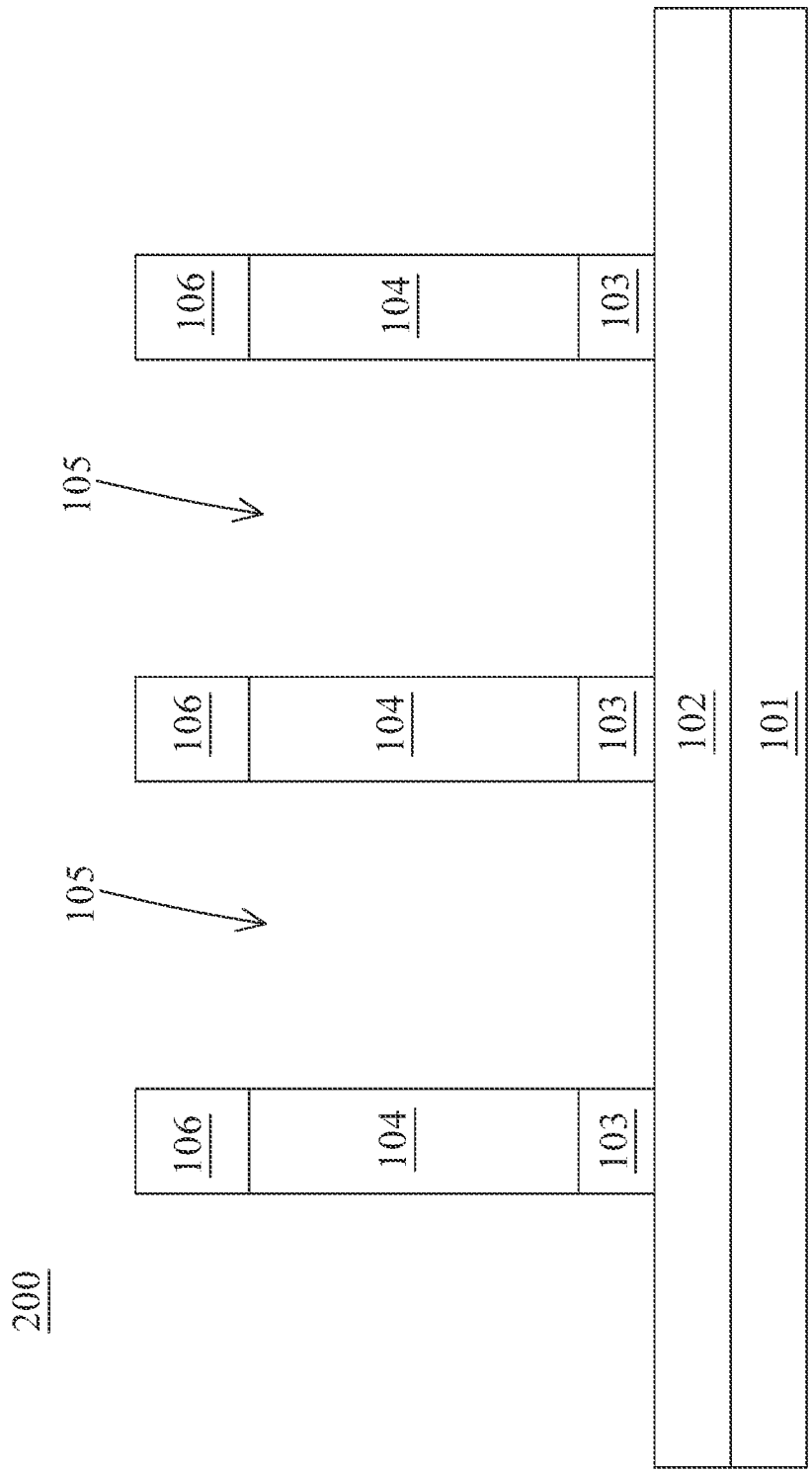

In some embodiments, after the removal of the portion of the barrier layer 103, the patterned hard mask 110 is removed as shown in FIGS. 19 to 20. In some embodiments, the second semiconductor structure 200 of FIG. 2 is prepared after the removal of the patterned hard mask 110 as shown in FIG. 20.

In some embodiments, the removal of the patterned hard mask 110 includes removing the second mask layer 109 as shown in FIG. 19 and removing the first mask layer 108 as shown in FIG. 20. In some embodiments, the first mask layer 108 and the second mask layer 109 are removed simultaneously or sequentially. In some embodiments, the first mask layer 108 and the second mask layer 109 are removed by photolithography, etching or any other suitable process.

Figure 21:
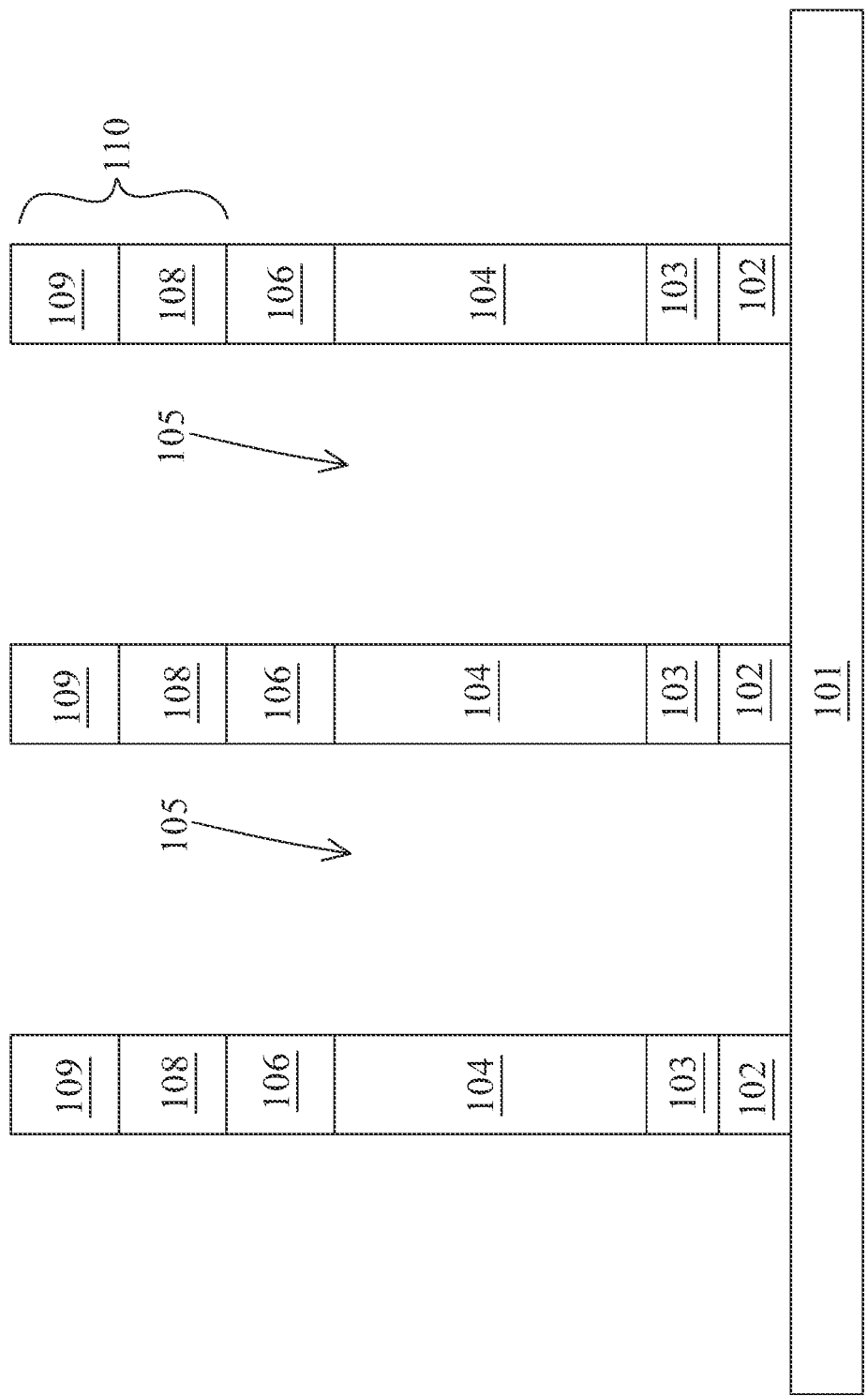

In some embodiments, the third semiconductor structure 300 of FIG. 3 can be prepared by the following steps after the removal of the portion of the barrier layer 103 as shown in FIG. 18. After the removal of the portion of the barrier layer 103 as shown in FIG. 18, a portion of the conductive film 102 exposed through the patterned hard mask 110 is removed as shown in FIG. 21. In some embodiments, the portion of the conductive film 102 is removed by photolithography, etching or any other suitable process. In some embodiments, the semiconductor substrate 101 is at least partially exposed through the conductive film 102 after the removal of the portion of the conductive film 102.

Figure 22:
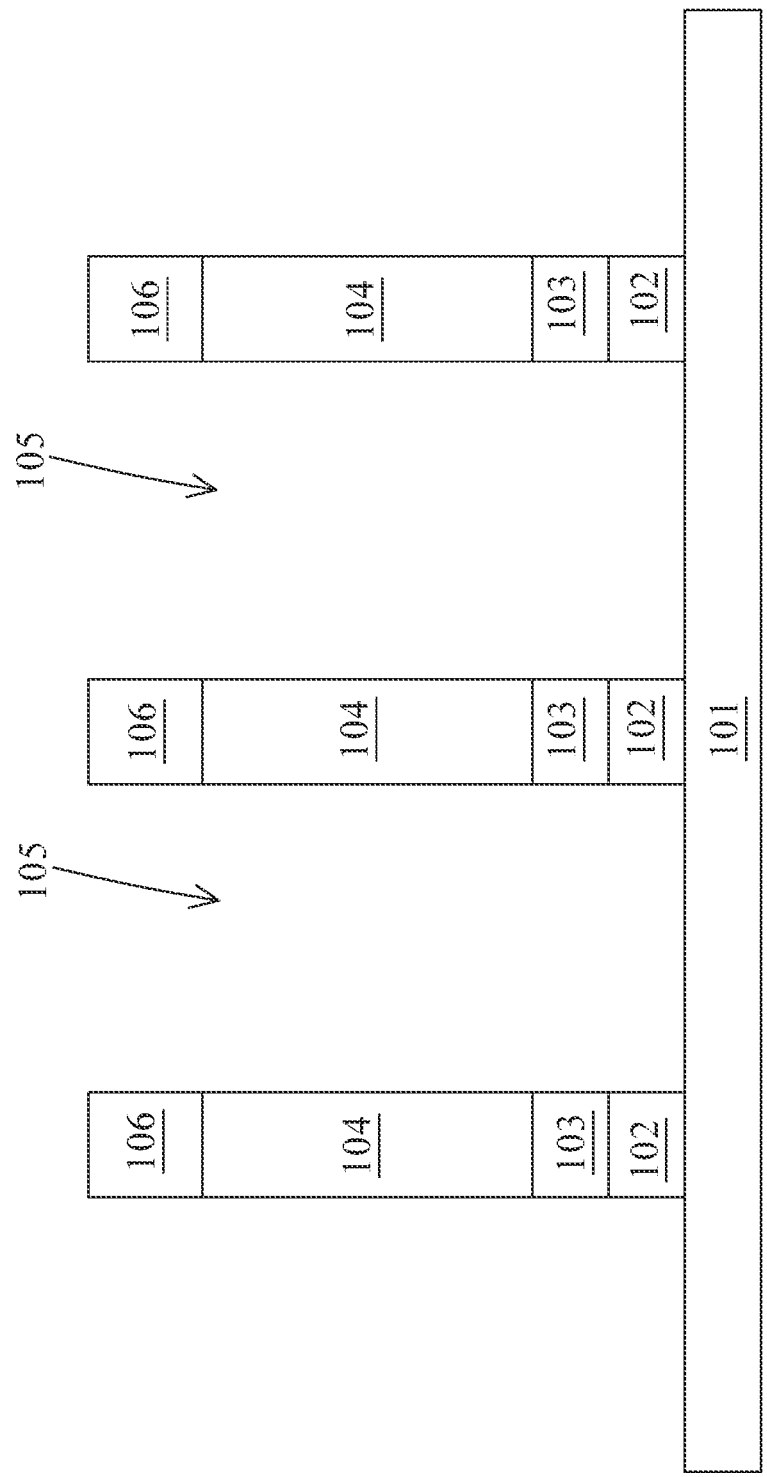

In some embodiments, after the removal of the portion of the conductive film 102, the patterned hard mask 110 is removed as shown in FIG. 22. In some embodiments, the removal of the patterned hard mask 110 includes removing the second mask layer 109 and removing the first mask layer 108 as shown in FIG. 22. In some embodiments, the first mask layer 108 and the second mask layer 109 are removed simultaneously or sequentially. In some embodiments, the first mask layer 108 and the second mask layer 109 are removed by photolithography, etching or any other suitable process.

Figure 23:
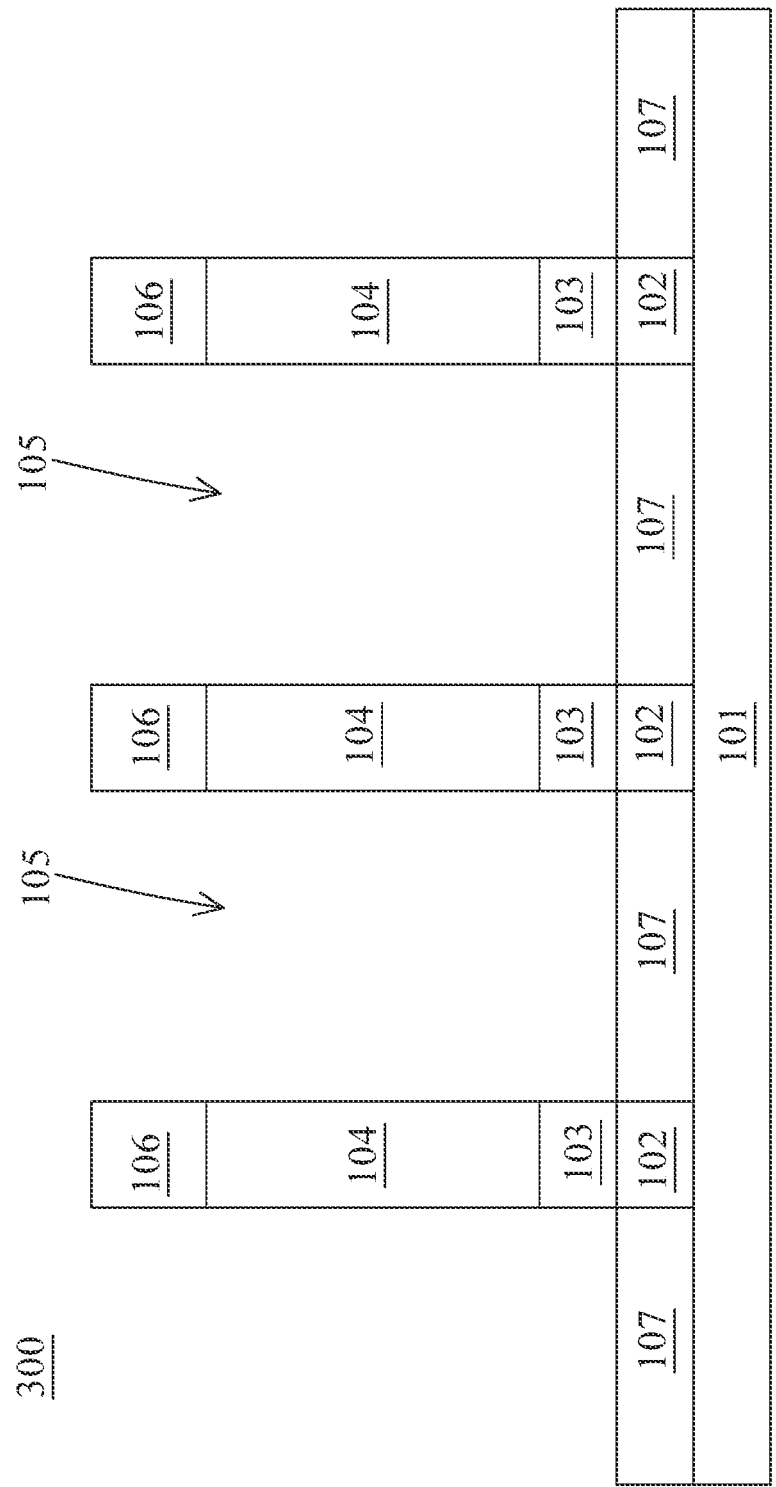

In some embodiments, after the removal of the portion of the conductive film 102, an isolation member 107 is disposed over the semiconductor substrate 101 and surrounded by the conductive film 102 as shown in FIG. 23. In some embodiments, the isolation member 107 is disposed between two adjacent portions of the conductive film 102, so as to electrically isolate the two adjacent portions of the conductive film 102.

In some embodiments, the isolation member 107 includes insulating material such as silicon oxide, silicon nitride, silicon oxynitride, the like, or a combination thereof. In some embodiments, the isolation member 107 is disposed by deposition, chemical vapor deposition (CVD) or any other suitable process. In some embodiments, the third semiconductor structure 300 of FIG. 3 is prepared after the disposing of the isolation member 107 as shown in FIG. 23.

In an aspect of the present disclosure, a method of preparing a semiconductor structure is provided. The method includes steps of providing a conductive film, disposing a barrier layer over the conductive film, disposing a first dielectric layer over the barrier layer, disposing a patterned hard mask over the first dielectric layer, and removing a portion of the first dielectric layer exposed through the patterned hard mask, wherein the removal of the portion of the first dielectric layer includes providing a nitrogen plasma to collide with the portion of the first dielectric layer.

In another aspect of the present disclosure, a method of preparing a semiconductor structure is provided. The method includes steps of providing a barrier layer, disposing a first dielectric layer over the barrier layer, disposing a second dielectric layer over the first dielectric layer, disposing a patterned hard mask over the second dielectric layer, forming an opening extending through the first dielectric layer and the second dielectric layer to at least partially expose the barrier layer, wherein the formation of the opening includes providing a plasma to collide with a portion of the first dielectric layer exposed through the patterned hard mask, and wherein the plasma is chemically unreactive with the first dielectric layer.

In another aspect of the present disclosure, a method of preparing a semiconductor structure is provided. The method includes steps of providing a black diamond layer; disposing a patterned hard mask over the black diamond layer; and removing a portion of the black diamond layer exposed through the patterned hard mask, wherein the removal of the portion of the black diamond layer includes colliding the portion of the black diamond layer by a plasma chemically unreactive with the black diamond layer.

In conclusion, because a nitrogen plasma is chemically unreactive with a low dielectric constant (low-k) layer in a semiconductor structure, the nitrogen plasma is used for removing a portion of the low-k layer. As such, formation of a by-product at a surface of the low-k layer can be minimized or prevented, and a dielectric constant of the low-k layer is not changed. In other words, an electrical resistance of the low-k layer is not increased. Therefore, an overall performance of the semiconductor structure and process of manufacturing the semiconductor structure are improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A method of preparing a semiconductor structure, comprising: providing a barrier layer;
    disposing a first dielectric layer over the barrier layer, the first dielectric layer comprises black diamond;
    disposing a second dielectric layer over the first dielectric layer;
    disposing a patterned hard mask over the second dielectric layer;
    forming an opening extending through the first dielectric layer and the second dielectric layer to at least partially expose the barrier layer,
    wherein the formation of the opening includes removing a portion of the first dielectric layer exposed through the patterned hard mask, and wherein removing the portion of the first dielectric layer includes colliding the portion of the first dielectric layer by a nitrogen plasma chemically unreactive with the first dielectric layer.

2. The method according to claim 1, wherein a depth of the opening is greater than about 5 nm.

3. The method according to claim 1, wherein the nitrogen plasma is chemically unreactive with black diamond.

4. The method according to claim 1, wherein the nitrogen plasma is chemically unreactive with carbon.

5. The method according to claim 1, wherein a chemical reaction between the first dielectric layer and the nitrogen plasma is absent during the formation of the opening.

6. The method according to claim 1, wherein an oxide disposed in the opening is absent.

7. The method according to claim 1, wherein an oxide disposed on the barrier layer is absent.

8. The method according to claim 1, wherein the formation of the opening includes removing a portion of the second dielectric layer exposed through the patterned hard mask.

9. The method according to claim 8, wherein the removal of the portion of the second dielectric layer is performed prior to the collision of the nitrogen plasma with the first dielectric layer.

10. The method according to claim 1, further comprising removing a portion of the barrier layer exposed through the opening.

11. The method according to claim 1, further comprising removing the patterned hard mask to expose the second dielectric layer.

12. A method of preparing a semiconductor structure, comprising:
    providing a black diamond layer;
    disposing a patterned hard mask over the black diamond layer; and
    removing a portion of the black diamond layer exposed through the patterned hard mask,
    wherein the removal of the portion of the black diamond layer includes colliding the portion of the black diamond layer by a nitrogen plasma chemically unreactive with the black diamond layer.

13. The method according to claim 12, wherein an oxide formed over the black diamond layer during the removal is absent.

14. The method according to claim 12, wherein the black diamond layer is chemically reactive with oxygen.

15. The method according to claim 12, wherein an electrical resistance and a dielectric constant of the black diamond layer remain unchanged before and after the removal.

16. The method according to claim 12, wherein the nitrogen plasma is free of oxygen.

* * * * *